(12) United States Patent
Chen et al.

(10) Patent No.: US 10,593,411 B1
(45) Date of Patent: Mar. 17, 2020

(54) MEMORY DEVICE WITH CHARGE ISOLATION TO REDUCE INJECTION TYPE OF PROGRAM DISTURB

(71) Applicant: SanDisk Technologies LLC, Addison, TX (US)

(72) Inventors: Hong-Yan Chen, San Jose, CA (US); Wei Zhao, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/281,572

(22) Filed: Feb. 21, 2019

(51) Int. Cl.
| | | |
|---|---|---|
| *G11C 16/34* | (2006.01) |
| *G11C 16/08* | (2006.01) |
| *G11C 16/16* | (2006.01) |
| *G11C 16/24* | (2006.01) |
| *G11C 16/28* | (2006.01) |
| *G11C 7/10* | (2006.01) |
| *G11C 11/56* | (2006.01) |
| *G11C 7/04* | (2006.01) |
| *G11C 16/32* | (2006.01) |

(52) U.S. Cl.
CPC ............ *G11C 16/3427* (2013.01); *G11C 7/04* (2013.01); *G11C 7/106* (2013.01); *G11C 11/5635* (2013.01); *G11C 11/5642* (2013.01); *G11C 16/08* (2013.01); *G11C 16/16* (2013.01); *G11C 16/24* (2013.01); *G11C 16/28* (2013.01); *G11C 16/32* (2013.01); *G11C 16/3459* (2013.01)

(58) Field of Classification Search
None
See application file for complete search history.

(56) References Cited

U.S. PATENT DOCUMENTS

| | | | |
|---|---|---|---|
| 7,440,323 B2 | 10/2008 | Lutze et al. | |
| 7,577,026 B2 | 8/2009 | Dong et al. | |
| 2016/0148691 A1* | 5/2016 | Rabkin | G11C 16/10 365/185.19 |

OTHER PUBLICATIONS

U.S. Appl. No. 15/814,772, filed Nov. 16, 2017 by Chen et al.

* cited by examiner

*Primary Examiner* — James G Norman
(74) *Attorney, Agent, or Firm* — Vierra Magen Marcus LLP

(57) ABSTRACT

Techniques are described for reducing an injection type of program disturb in a memory device. A charge isolation region is created in a channel of a NAND string on the source side of the selected word line, WLn, and spaced apart from WLn by one or more other word lines, when the program voltage is increased to a program voltage (Vpgm). The isolation region is created by applying 0 V or other low voltage to an isolation word line. The isolation region is maintained for a first portion of a time period in which Vpgm is applied. The charge isolation region can be modified based on factors associated with a risk of program disturb including the magnitude of Vpgm, the position of WLn in a set of word lines and an ambient temperature.

20 Claims, 25 Drawing Sheets

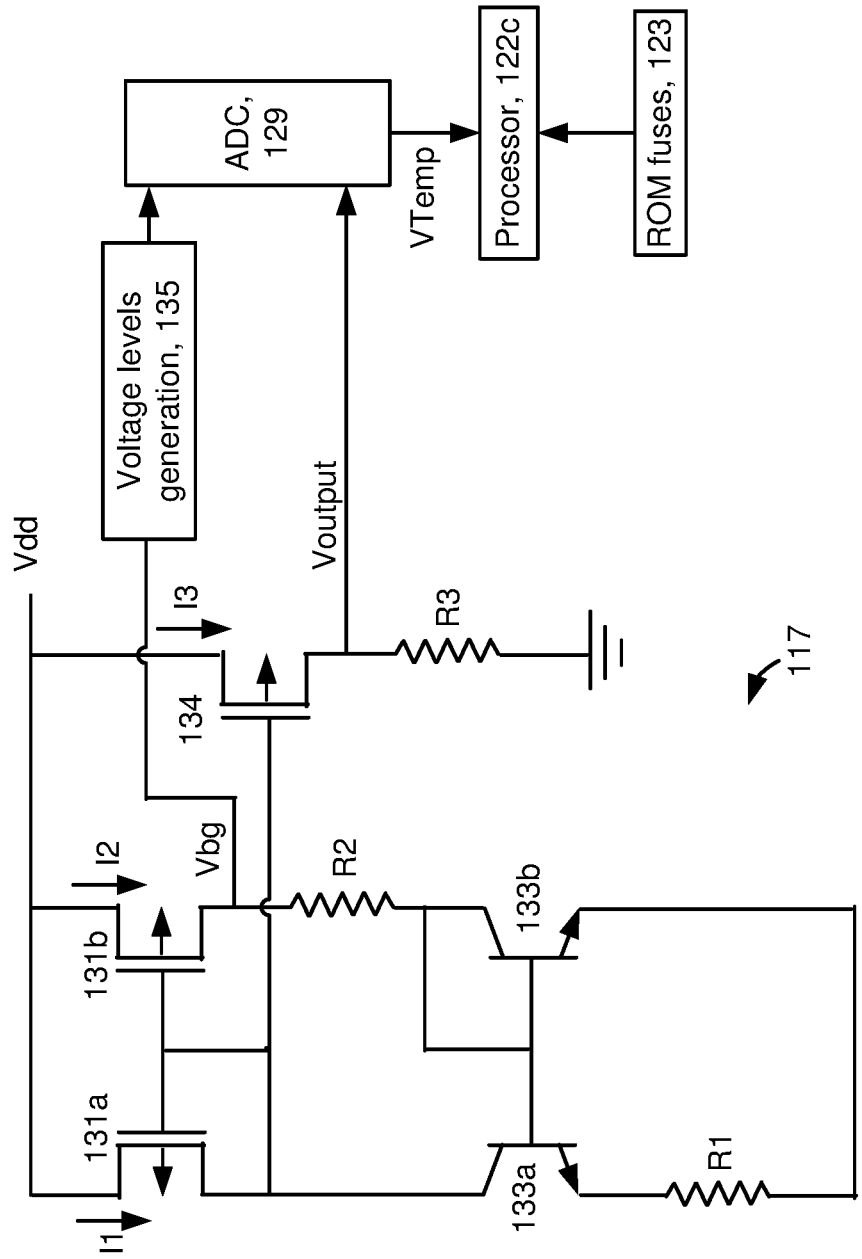

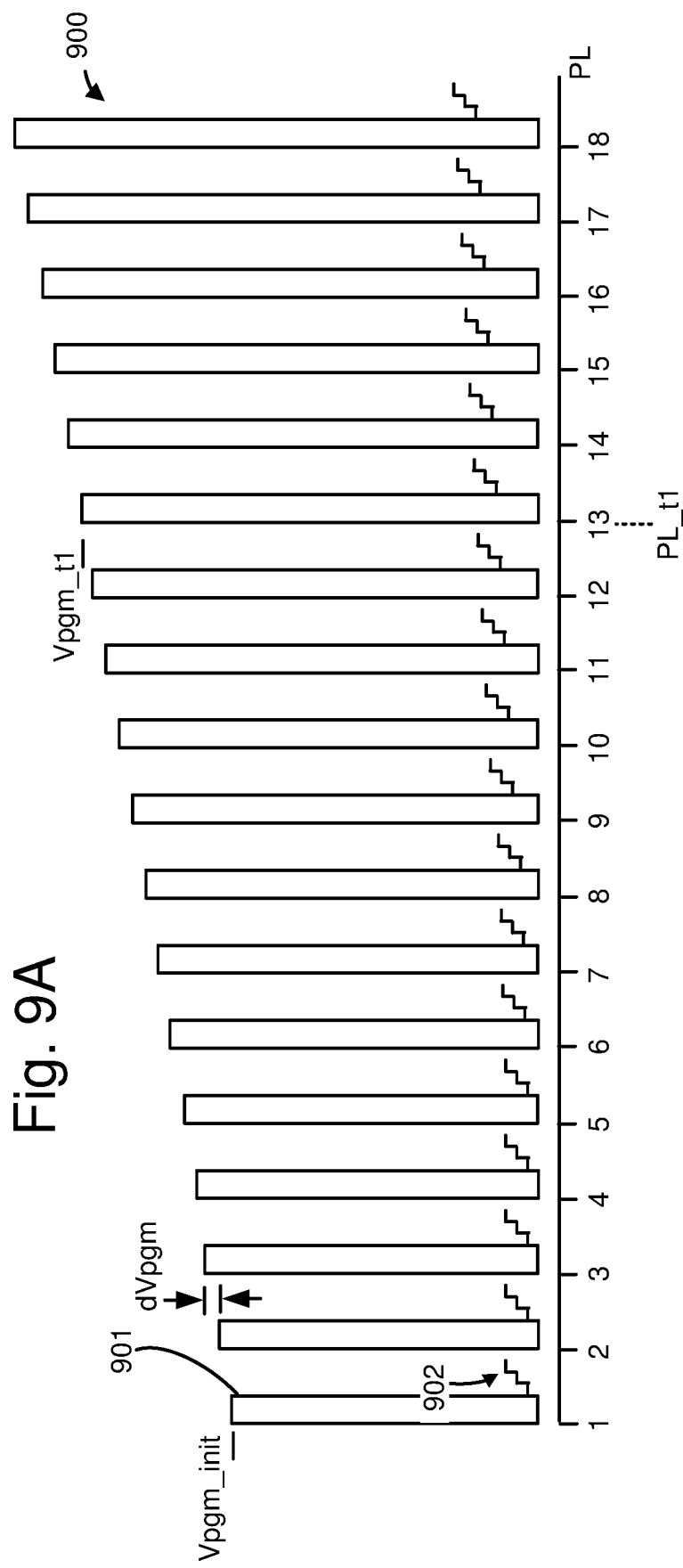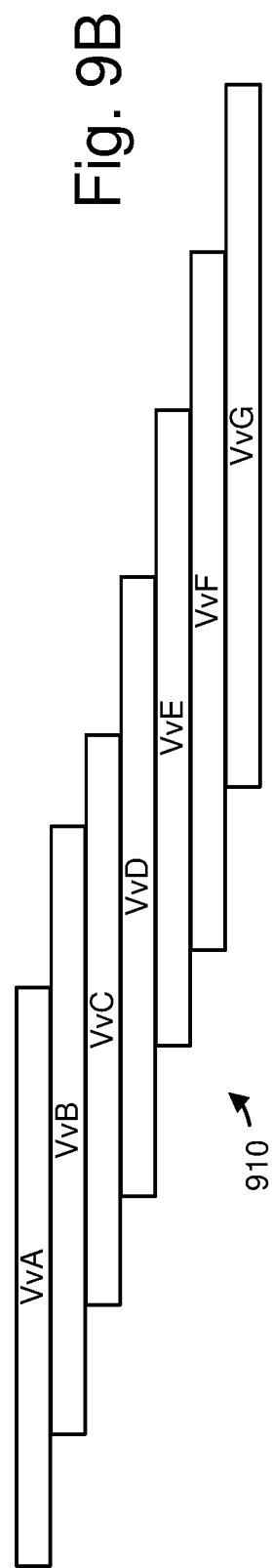

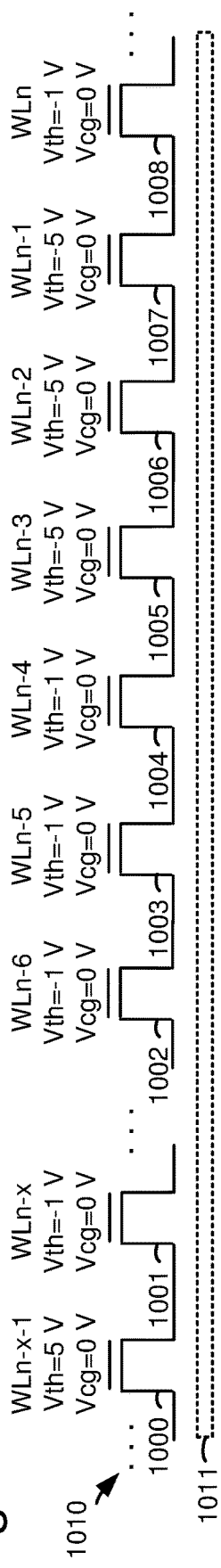
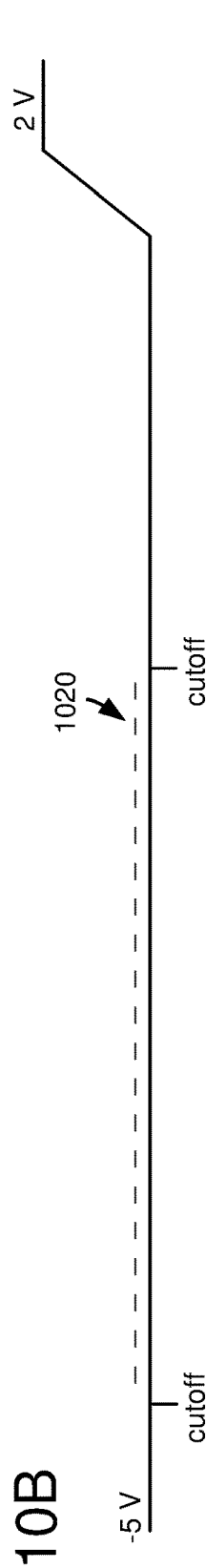
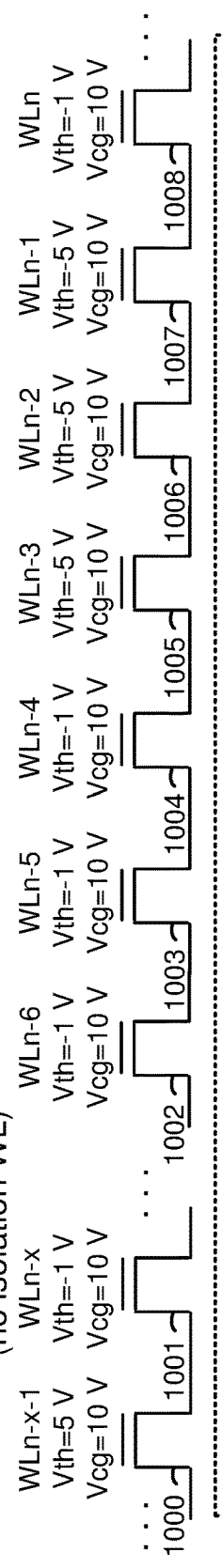
Fig. 10A Pre-charge
Fig. 10B
Fig. 10C Example 1-Vpass ramp up (no isolation WL)
Fig. 10D

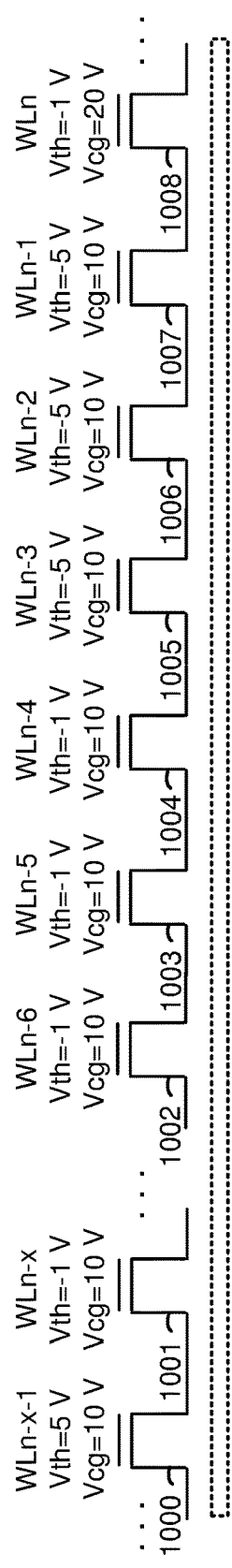
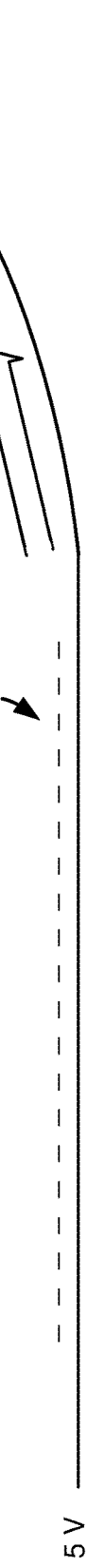

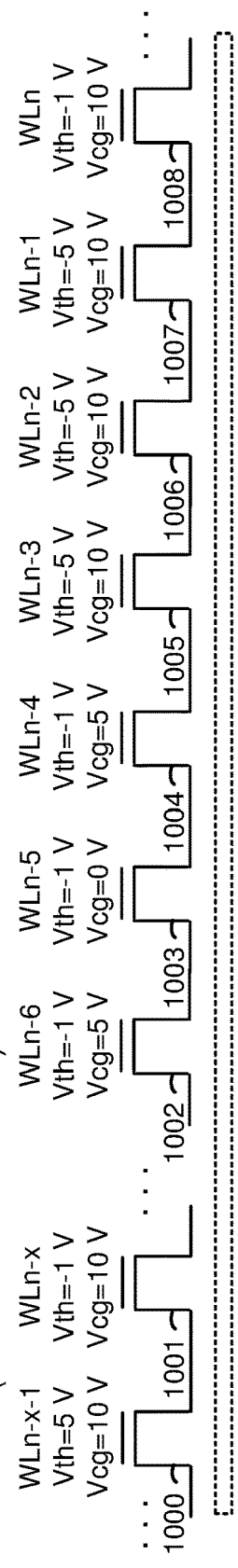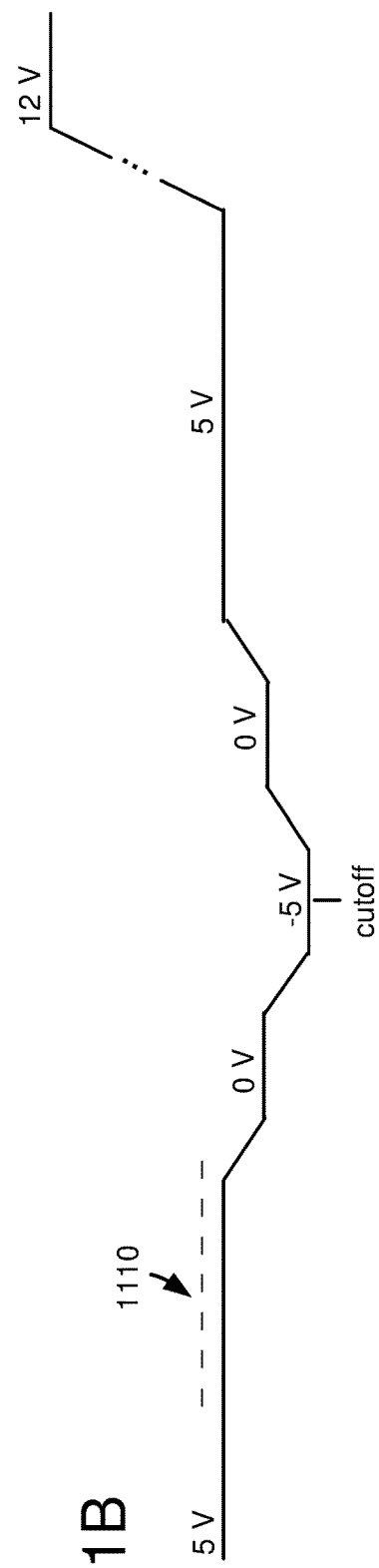
Fig. 11A Example 2-Vpass ramp up (isolation WL at WLn-5)
Fig. 11B

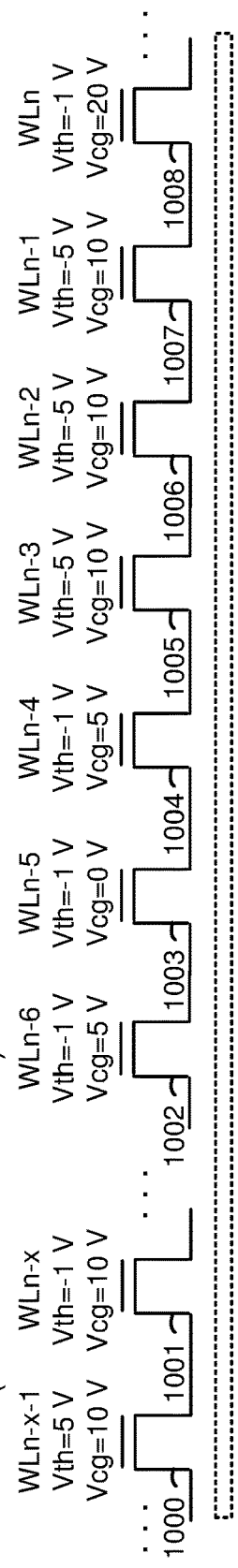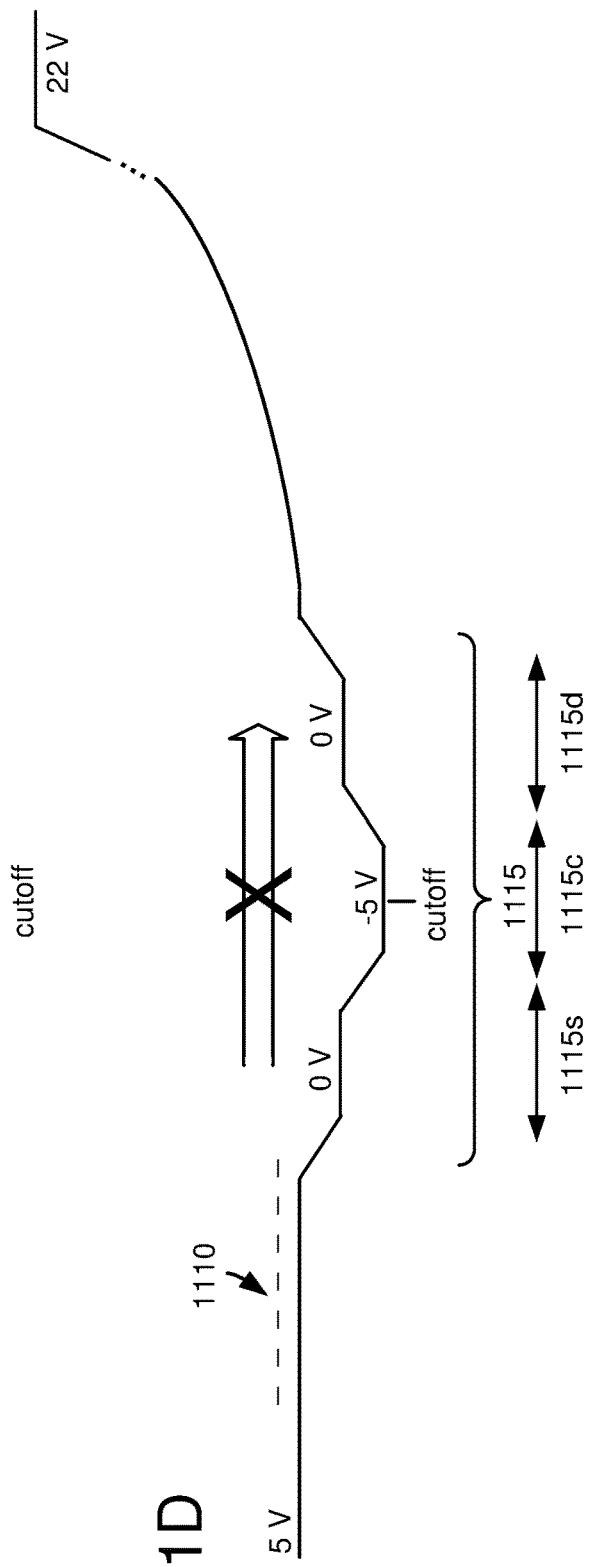

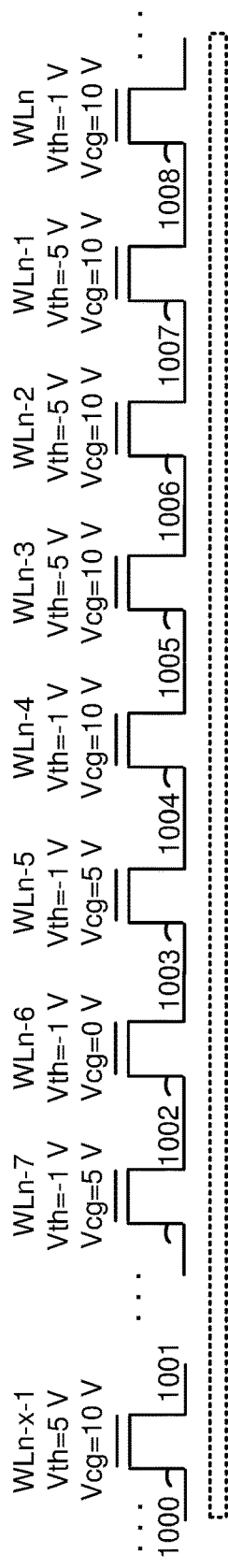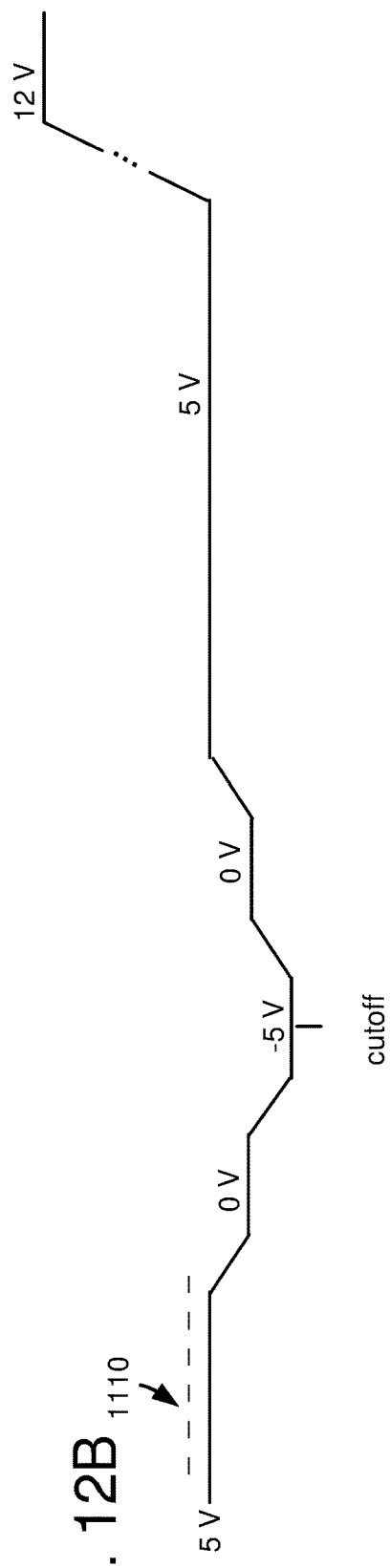
Fig. 12A Example 3-Vpass ramp up (isolation WL at WLn-6)
Fig. 12B

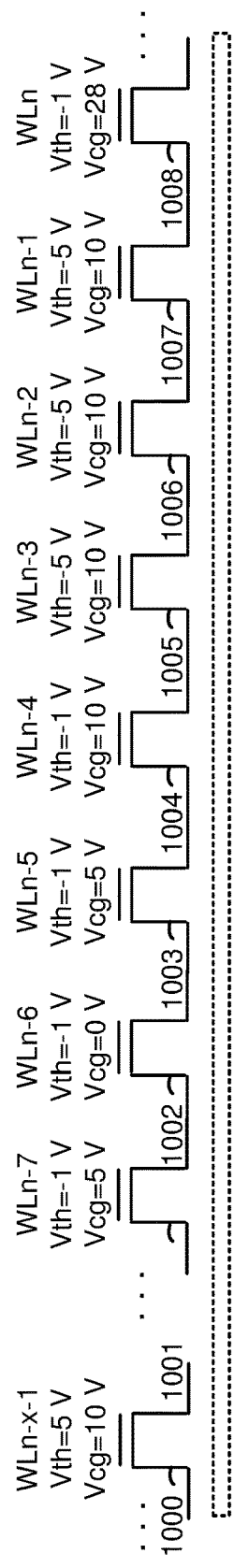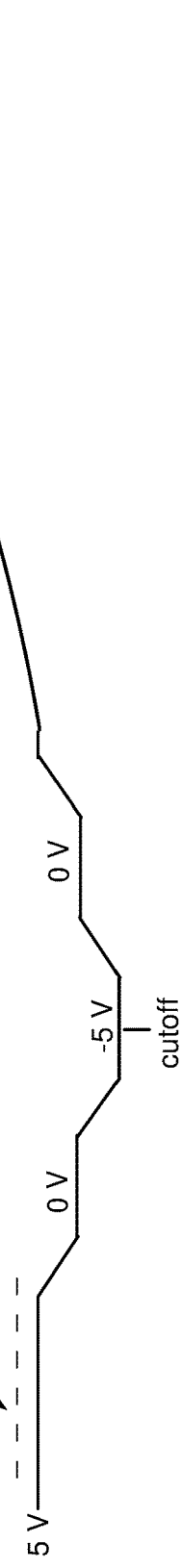

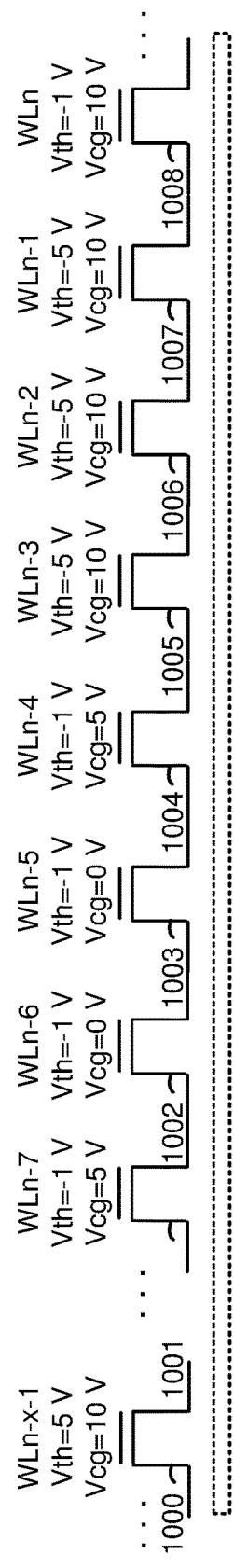
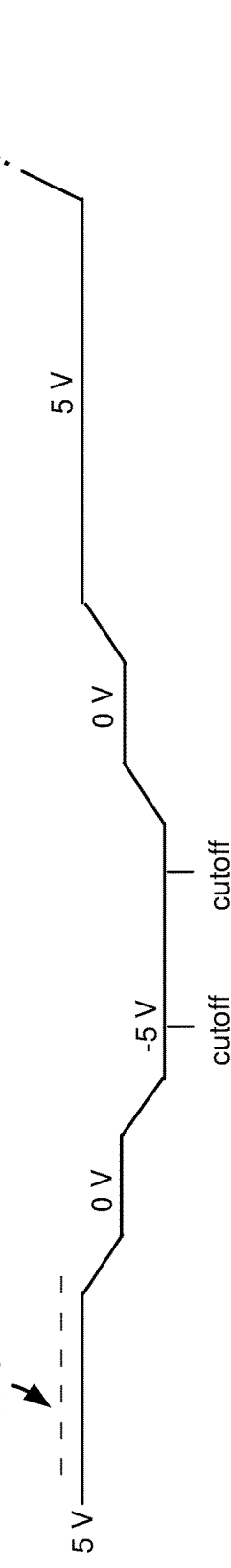

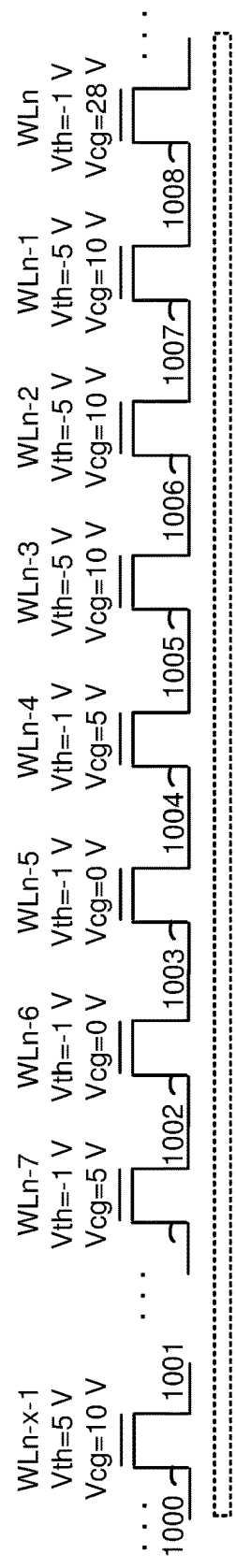
Fig. 13C Example 4-Vpgm ramp up (isolation WLs at WLn-5 and WLn-6)
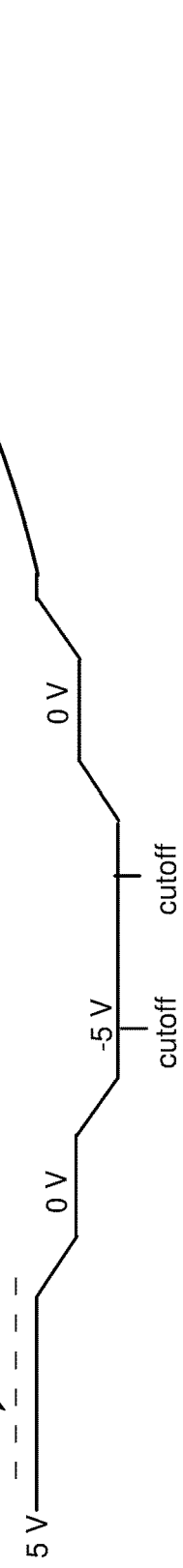
Fig. 13D

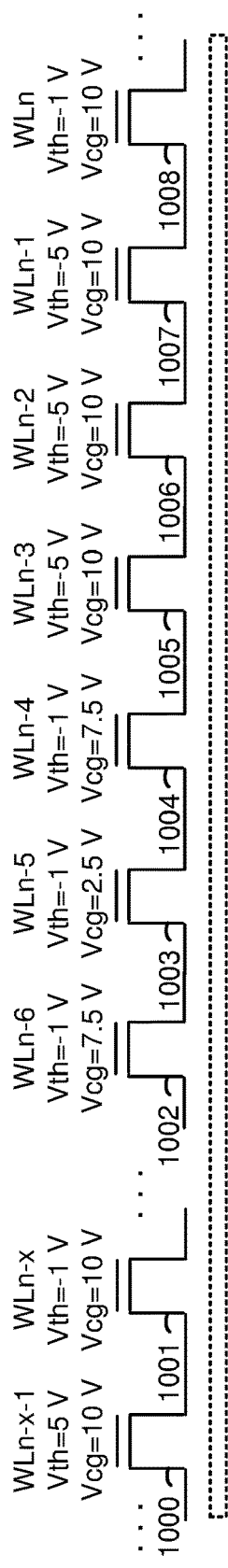
Fig. 14A  Example 5-Vpass ramp up (partial isolation WL at WLn-5)
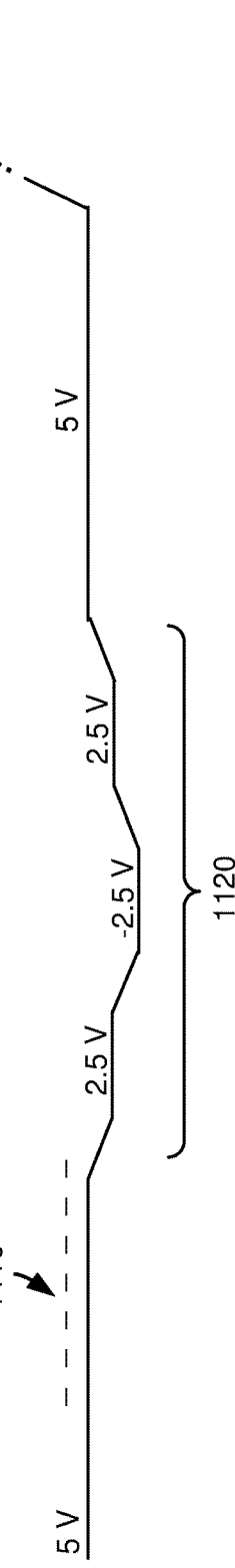
Fig. 14B

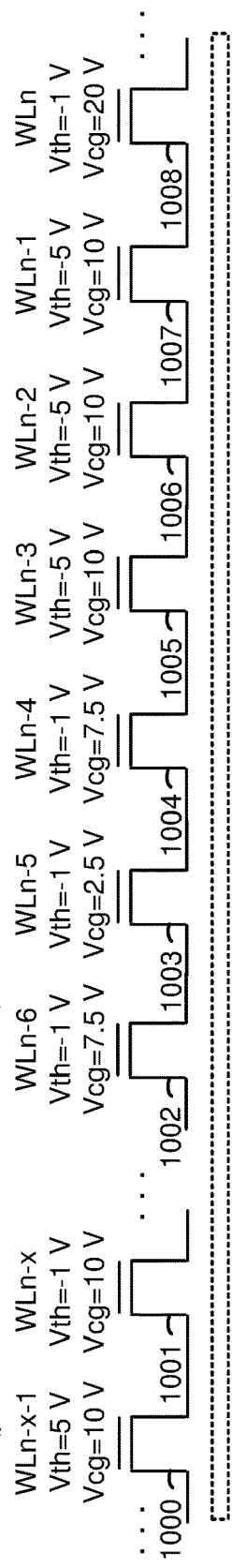
Fig. 14C  Example 5-Vpgm ramp up
(partial isolation WL at WLn-5)
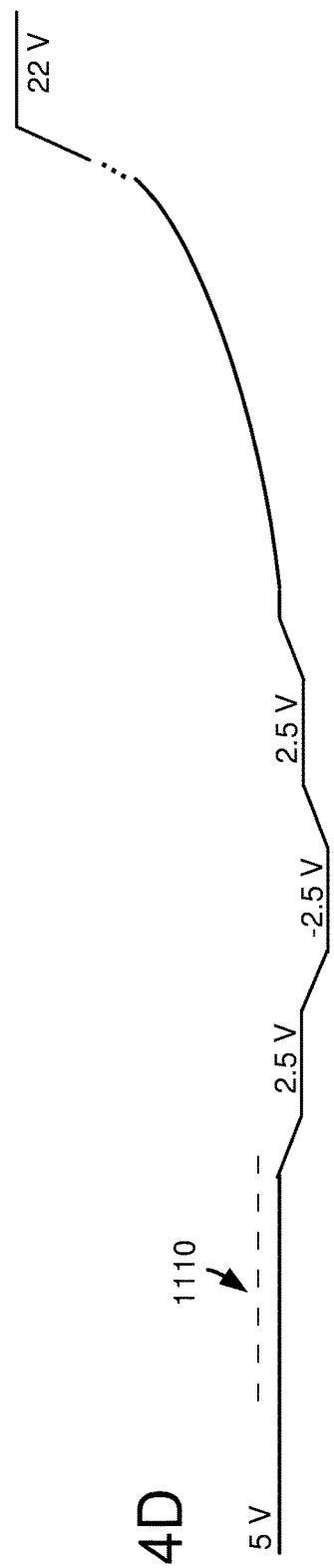
Fig. 14D

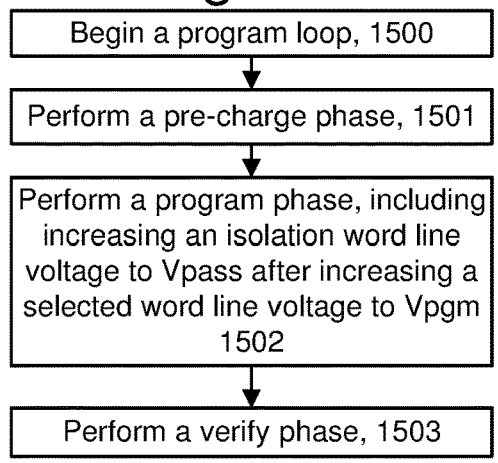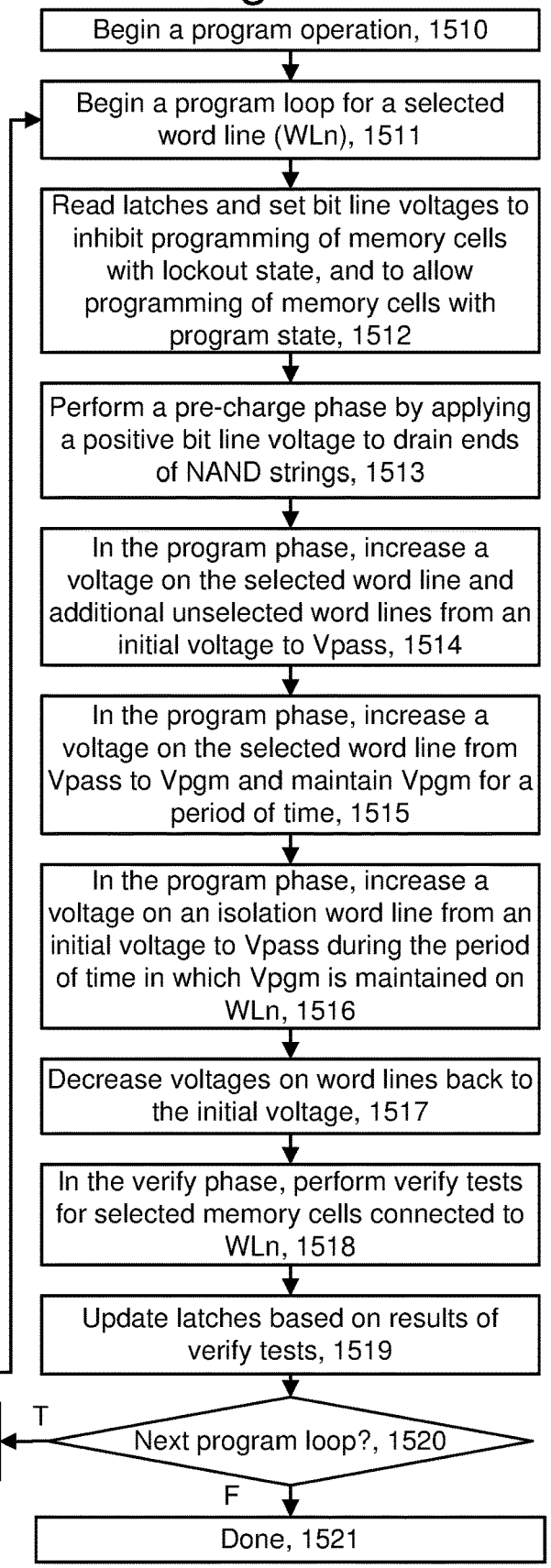

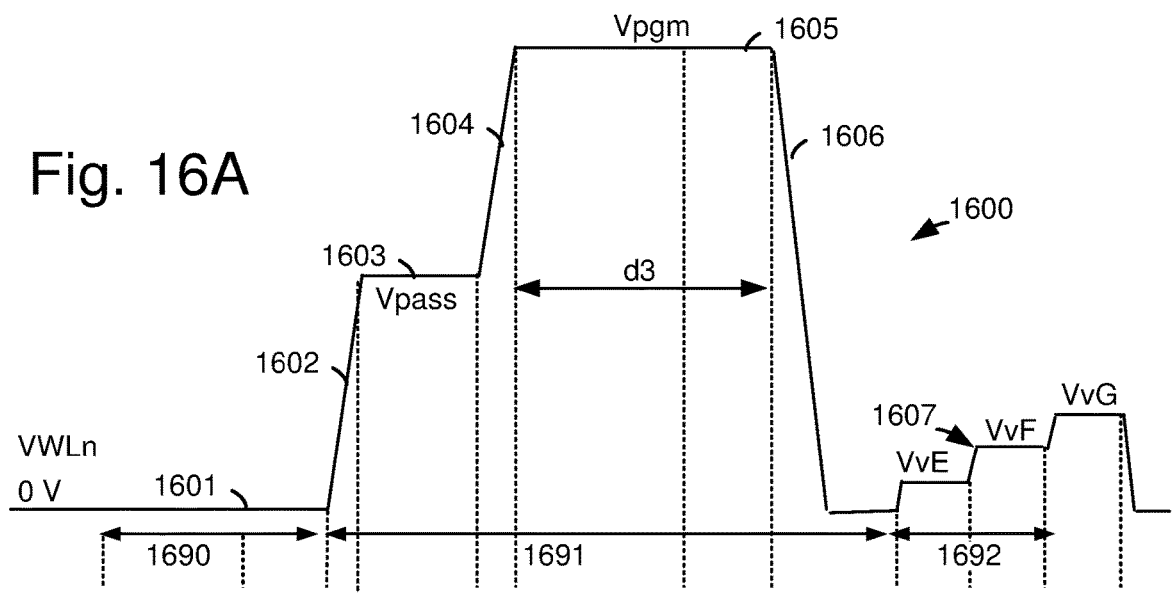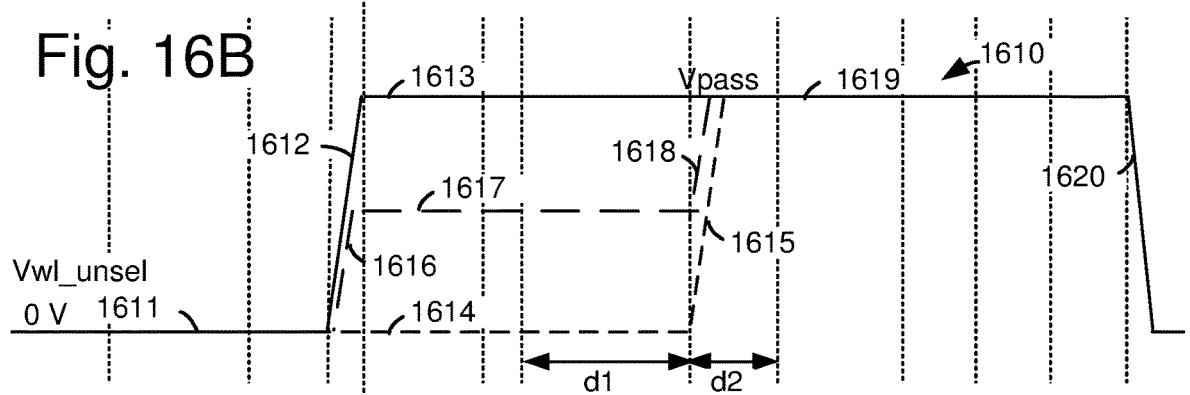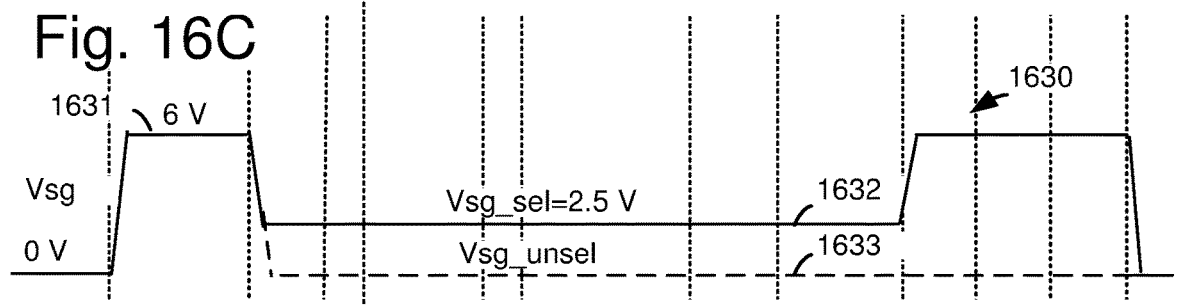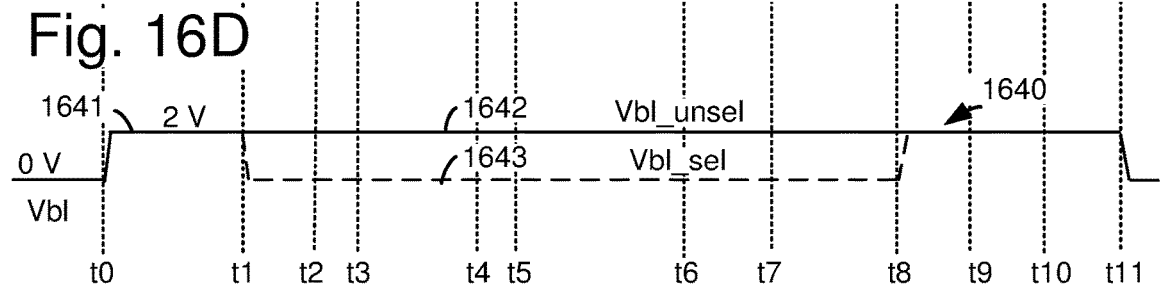

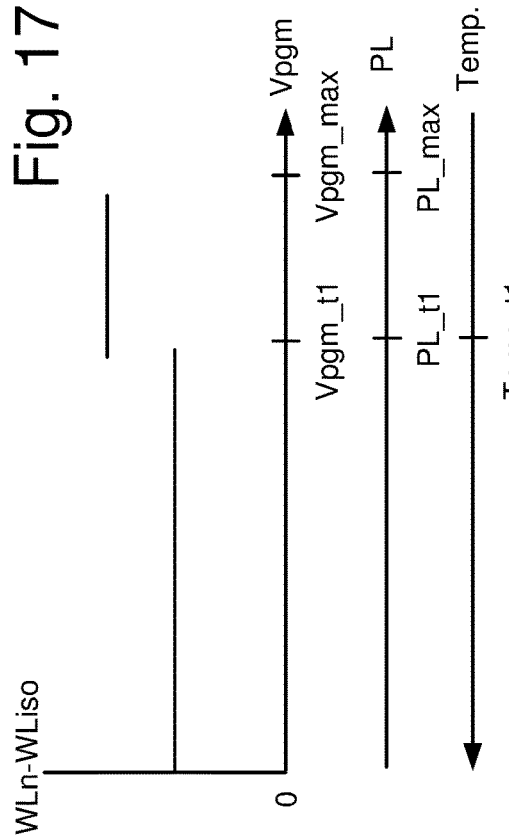
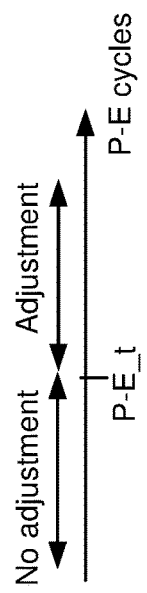
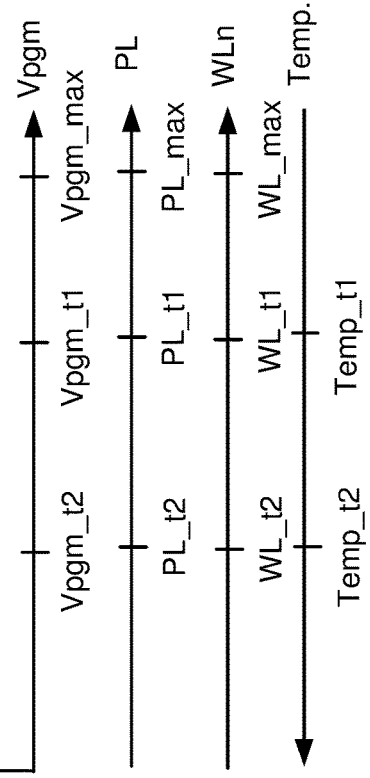

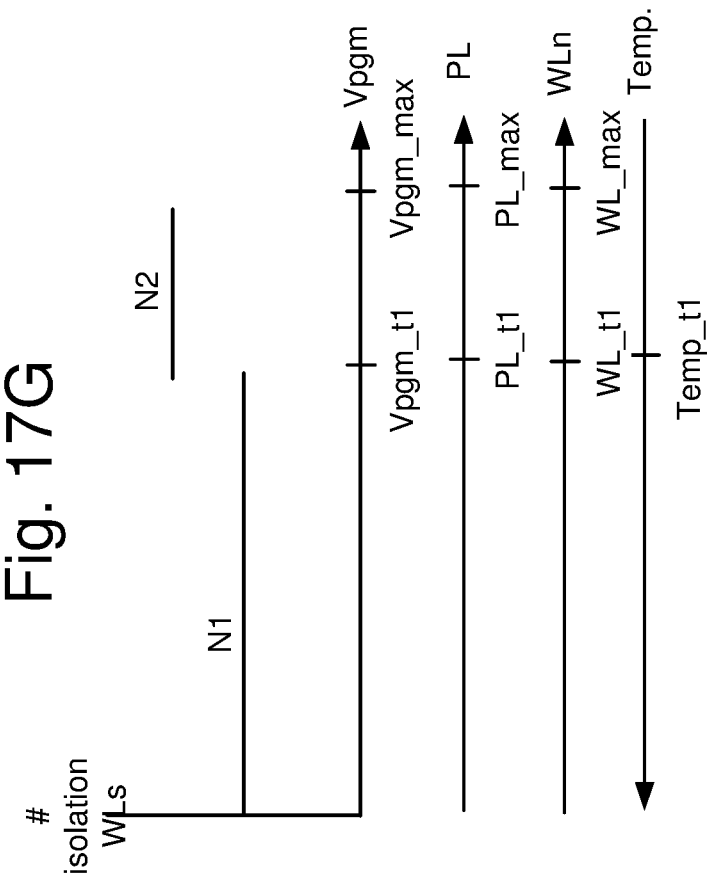

MEMORY DEVICE WITH CHARGE ISOLATION TO REDUCE INJECTION TYPE OF PROGRAM DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B depicts an example of the temperature-sensing circuit 116 of FIG. 1A.

FIG. 9A depicts an example voltage signal in a program operation.

FIG. 9B depicts an example of verify voltages used in different program loops of FIG. 9A.

FIG. 10A depicts an example NAND string 1010 and its channel 1011, showing voltages during a pre-charge phase of a program loop.

FIG. 10B depicts example channel voltages along the length of the NAND string of FIG. 10A.

FIG. 10C depicts the example NAND string of FIG. 10A when word line voltages are increased to Vpass, in an Example 1.

FIG. 10D depicts example channel voltages along the length of the NAND string of FIG. 10C.

FIG. 10E depicts the example NAND string of FIG. 10A when the selected word line voltage is increased to Vpgm.

FIG. 10F depicts example channel voltages along the length of the NAND string of FIG. 10E.

FIG. 11A depicts the example NAND string of FIG. 10A when word line voltages are increased to Vpass, in an Example 2.

FIG. 11B depicts example channel voltages along the length of the NAND string of FIG. 11A.

FIG. 11C depicts the example NAND string of FIG. 11A when the selected word line voltage is increased to Vpgm.

FIG. 11D depicts example channel voltages along the length of the NAND string of FIG. 11C.

FIG. 12A depicts the example NAND string of FIG. 10A when word line voltages are increased to Vpass, in an Example 3.

FIG. 12B depicts example channel voltages along the length of the NAND string of FIG. 12A.

FIG. 12C depicts the example NAND string of FIG. 12A when the selected word line voltage is increased to Vpgm.

FIG. 12D depicts example channel voltages along the length of the NAND string of FIG. 12C.

FIG. 13A depicts the example NAND string of FIG. 10A when word line voltages are increased to Vpass, in an Example 4.

FIG. 13B depicts example channel voltages along the length of the NAND string of FIG. 13A.

FIG. 13C depicts the example NAND string of FIG. 13A when the selected word line voltage is increased to Vpgm.

FIG. 13D depicts example channel voltages along the length of the NAND string of FIG. 13C.

FIG. 14A depicts the example NAND string of FIG. 10A when word line voltages are increased to Vpass, in an Example 5.

FIG. 14B depicts example channel voltages along the length of the NAND string of FIG. 14A.

FIG. 14C depicts the example NAND string of FIG. 14A when the selected word line voltage is increased to Vpgm.

FIG. 14D depicts example channel voltages along the length of the NAND string of FIG. 14C.

FIG. 15A depicts an example process for performing a program loop in which a charge isolation technique is used as a program disturb countermeasure.

FIG. 15B depicts an example process for performing a program operation which uses the process of FIG. 15A.

FIG. 16A-16D depicts examples of voltage signals which can be used in a program loop of a program operation, consistent with FIGS. 15A and 15B.

FIG. 16A depicts voltages applied to a selected word line.

FIG. 16B depicts voltages applied to unselected word lines.

FIG. 16C depicts voltages applied to select gate transistors.

FIG. 16D depicts voltages applied to bit lines.

FIG. 17C depicts an example plot indicating an adjustment regarding when to implement the charge isolation technique of FIG. 17A or 17B as a function of a number of program-erase cycles.

FIG. 17D depicts an example plot indicating a number of word lines separating the selected word line, WLn, and the isolation word line, WLiso, as a function of Vpgm, PL and Temp.

FIG. 17E depicts an example plot indicating a delay between the increase in the voltage of WLn to Vpgm and an increase in the voltage of WLiso from 0 V to Vpass, as a function of Vpgm, PL, WLn position and Temp.

FIG. 17F depicts another example plot indicating a delay between the increase in the voltage of WLn to Vpgm and an increase in the voltage of WLiso from 0 V to Vpass, as a function of Vpgm, PL, WLn position and Temp.

FIG. 17G depicts an example plot indicating a number of isolation word lines to use as a function of Vpgm, program loop (PL), WLn position and temperature (Temp.).

DETAILED DESCRIPTION

Figure 1A:
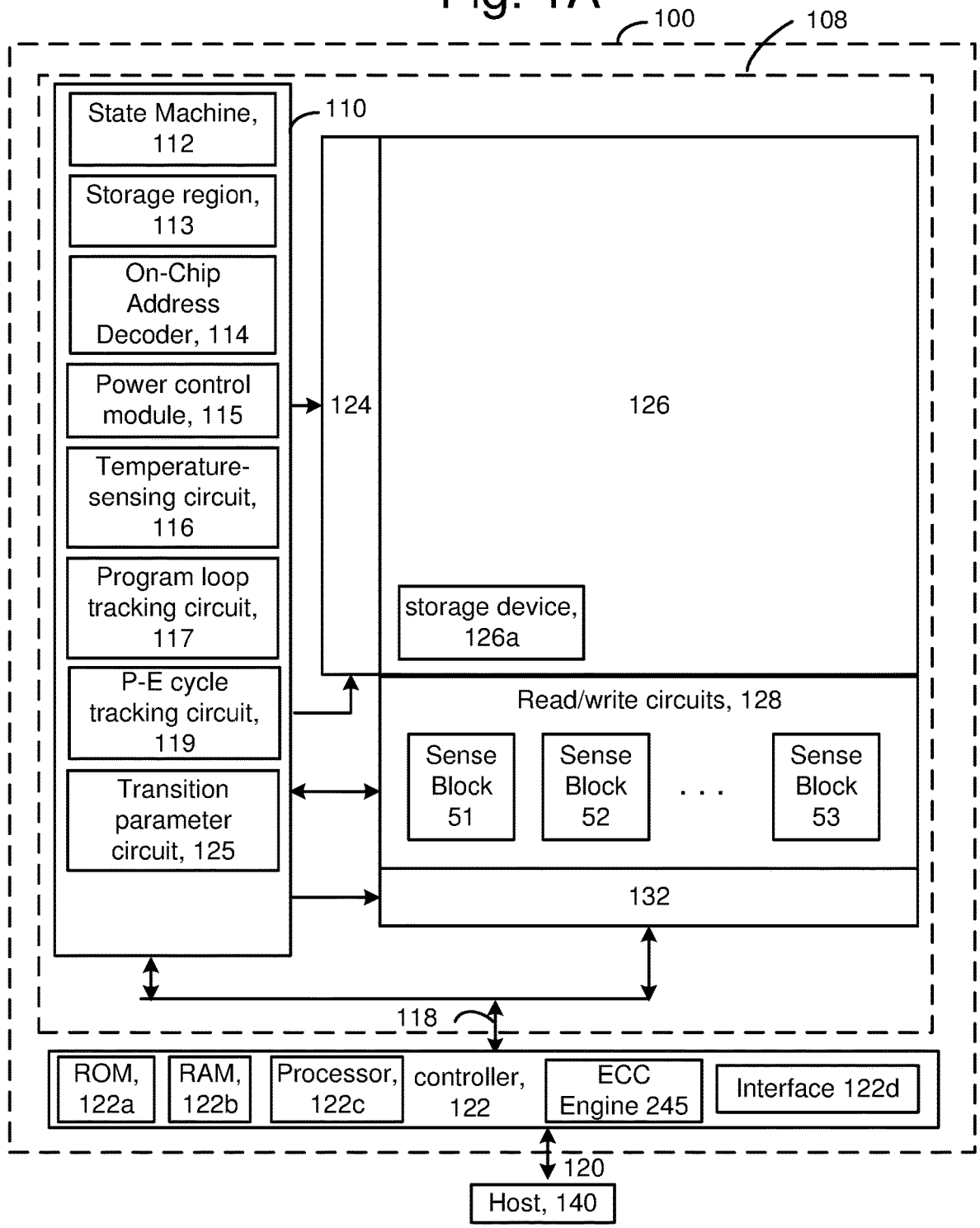
FIG. 1A is a block diagram of an example memory device.

Apparatuses and techniques are described for reducing program disturb in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9A. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells.

However, the Vth of a memory cell can change due to program disturb. Program disturb refers to inadvertent programming of memory cells. Typically, program disturb occurs for unselected memory cells connected to a selected word line during the programming of selected memory cells connected to the selected word line. The unselected memory cells have a lockout status, indicating that they are either assigned to the erased state and therefore should not be programmed, or they have completed programming to their assigned data state and therefore should not be further programmed. The selected memory cells have a program status, indicating that they should be programmed in the current program loop. Program disturb may be caused by a high control gate-to-channel voltage across the unselected memory cells due to the application of a high program voltage on the selected word line.

Another mechanism for program disturb, referred to as hot carrier (electron) injection type of program disturb, occurs due to the presence of voltage gradients and residue electrons in the channel of a NAND string. For example, residue electrons can remain in the channel after a sensing operation, such as a read operation or the verify test in a program operation. The residue electrons tend to be trapped in the channel on a source side of a selected word line, WLn, being programmed. The residue electrons are not able to leave the channel until the program voltage (Vpgm), e.g., 20-30 V is applied. At this time, a pass voltage, Vpass, such as 8-10 V, is applied to the unselected word lines Since Vpgm is much higher than Vpass, the channel region on the source side of can become conductive, allowing the electrons to move toward WLn and be injected into the associated memory cells, causing program disturb. See FIG. 10A-10F.

The channel region on the source side of WLn becomes conductive due to a drain-induced barrier lowering (DIBL) effect. DIBL is a short channel effect of a transistor in which the Vth decreases as the drain voltage increases. When Vpgm is applied to WLn, the voltage of the channel region adjacent to WLn also increases significantly, where this voltage is the drain voltage for the memory cells on the source side of WLn. The decrease in the Vth for the memory cells on the source side of WLn allows the associated channel region of some of the unselected memory cells to become conductive. For example, this conductivity can extend over a few word lines on the source side of WLn. The increased voltage of the channel region adjacent to WLn results in a lateral electric field in the channel which accelerates the source side residue electrons toward WLn.

Techniques provided herein address the above and other issues. In one aspect, an isolation region is created in a channel of a NAND string on the source side of WLn when the program voltage is initially increased from Vpass to Vpgm. The isolation region is created by applying 0 V or other low voltage to an isolation word line, WLiso, which is separated from WLn by one or more other word lines. The isolation region is maintained for a first portion (d1) of a time period (d3) in which Vpgm is applied (FIGS. 16A and 16B). When WLiso is at the low voltage and Vpgm is applied to WLn, residue electrons are prevented from moving toward WLn because a cutoff (non-conductive) region is created in the channel adjacent to WLiso. See FIG. 11D. The charges on the source side of the NAND string are therefore isolated. Also in the first portion of the time period, the channel voltage adjacent to WLn decays so that the DIBL effect which tends to allow the residue electrons to move toward WLn is also reduced. At the end of the first portion of the time period, the voltage on Viso can be increased from 0 V to Vpass, for instance. This allows the channel regions adjacent to WLiso to be boosted to prevent potential program disturb, especially for erased state memory cells, due to a high control gate-to-channel voltage. This type of program disturb, also referred to Vpass disturb can occur for memory cells connected to unselected word lines.

In one approach, the likelihood of the injection type of program disturb is greater when the ambient temperature of the memory device is lower. At lower temperatures, electrons encounter fewer scattering events when flowing in the channel due to phonon scattering, which is proportional to temperature. Therefore, the electrons may keep a higher velocity and have a higher probability of being injected into the memory cells. Accordingly, in one approach, the charge isolation technique can be used when the temperature is at or below a transition temperature, Temp_t1, such as 40 C, but not when the temperature is above the transition temperature. See FIG. 17A.

In another approach, the likelihood of the injection type of program disturb is greater when the program voltage (Vpgm) is greater. When Vpgm is greater, the DIBL effect which causes the source side memory cells to become conductive is greater. Accordingly, the charge isolation technique can be used when Vpgm is at or above a transition Vpgm, Vpgm_t1, but not when the Vpgm is below the transition Vpgm. See FIG. 17A.

In another approach, the charge isolation technique can be implemented with two or more different levels. For instance, the charge isolation technique may be not be used, used to a partial degree or used to a full degree when the risk of the injection type of program disturb is relatively small, moderate or relatively high, respectively. See FIG. 17B.

In another approach, the number of word lines which separate WLiso and WLn can be higher when Vpgm is higher. See FIG. 17D. This decreases the channel gradient which is created between WLiso and WLn to avoid disturbs.

In another approach, the delay before increasing the WLiso voltage from 0 V to Vpass, relative to the time at which the WLn voltage is increased from Vpass to Vpgm, or from 0 V to Vpgm, can be increased when the risk of the injection type of program disturb is greater. For example, the delay can be greater when the temperature is lower, Vpgm is greater or the WLn position is further from the source ends of the NAND strings. See FIGS. 17E and 17F.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 115 (power control circuit), a temperature-sensing circuit 116, a program loop tracking circuit 117, a P-E cycle tracking circuit 119, and a transition parameter circuit 125. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation, for example, for use by the transition parameter circuit. The program loop tracking circuit 117 can detect when a current program loop number reaches a specified number, or when a current program pulse magnitude (Vpgm) reaches a specified level for use, e.g., in connection with FIG. 17A to 17F. The P-E cycle tracking circuit 119 can track a number of P-E cycles which are accumulated over time by a block or other set of memory cells for use, e.g., in connection with FIG. 17C. The transition parameter circuit 125 can store transition parameters such as temperature, program voltage, program loop number. P-E cycles and word line position for implementing the techniques of FIG. 17A-17F, for example.

See FIG. 1B for an example implementation of the temperature-sensing circuit. The temperature-sensing circuit, program loop tracking circuit, P-E cycle tracking circuit, and transition parameter circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, program loop tracking circuit 117, P-E cycle tracking circuit 119, transition parameter circuit 125, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122c. This is data indicating a temperature of the memory device. ROM fuses 123 store data which correlates the matching voltage level to a temperature, in one approach. The processor then uses the temperature to set temperature-based parameters in the memory device such as by using the transition parameter circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
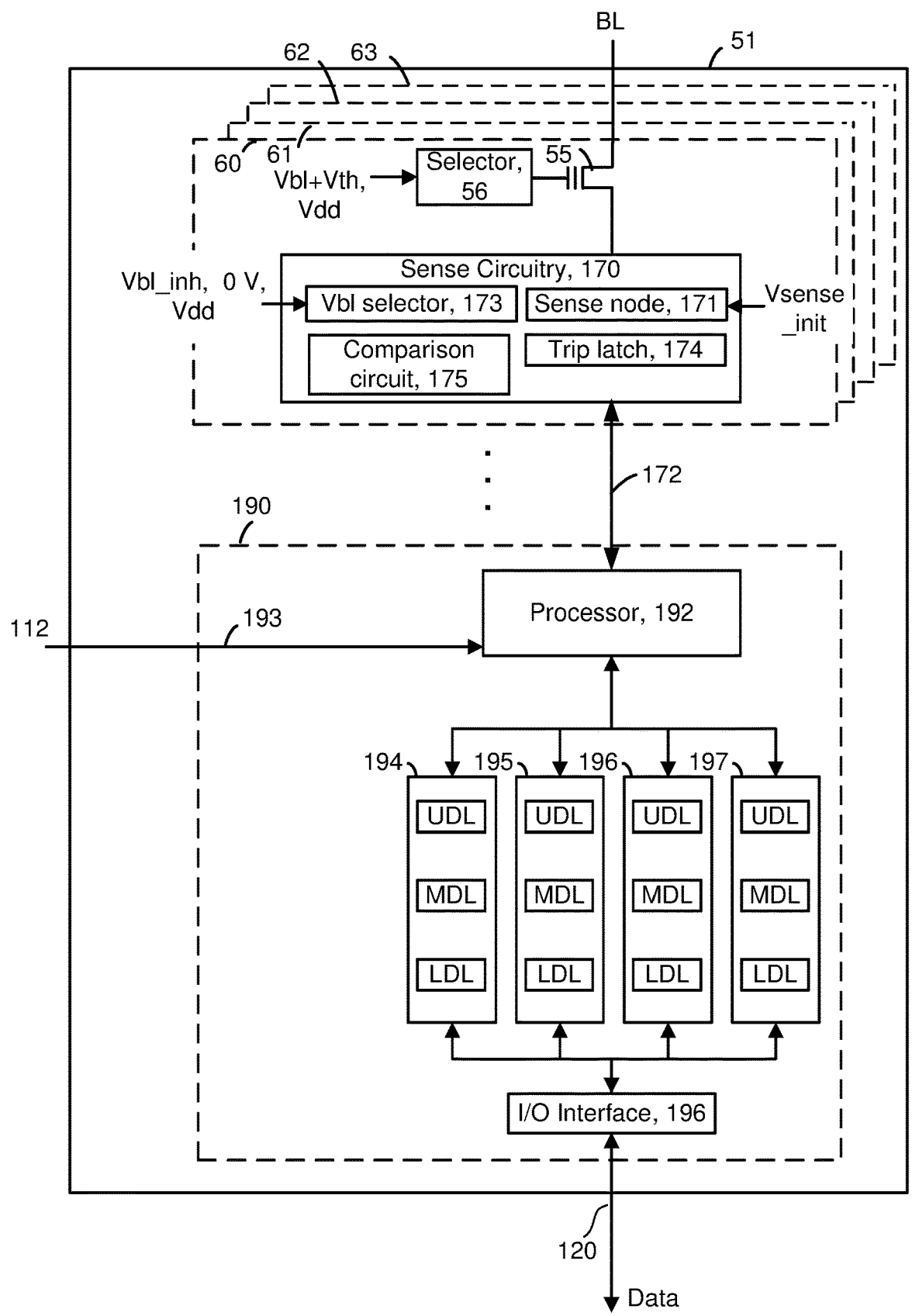
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR' d together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
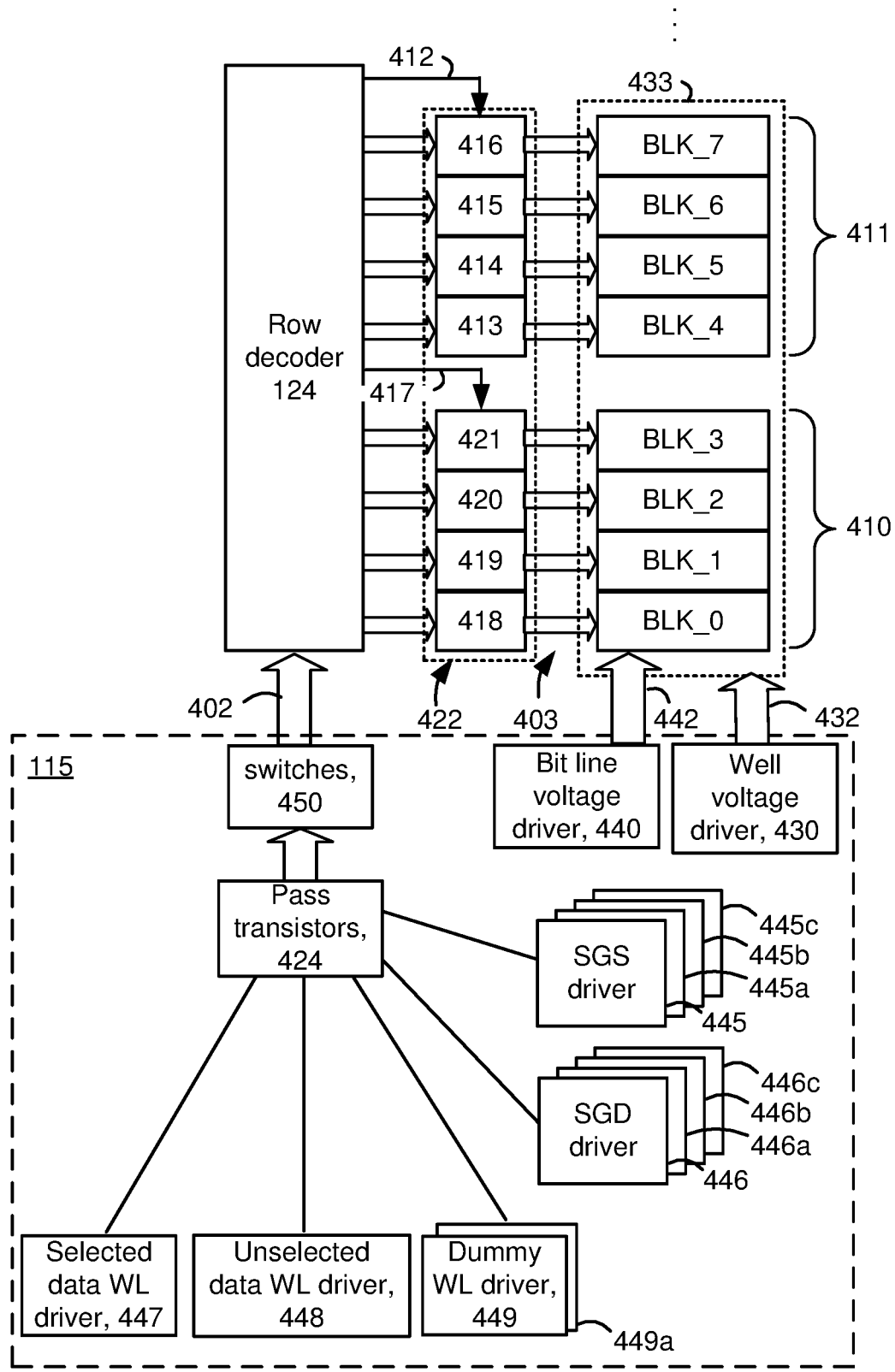
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
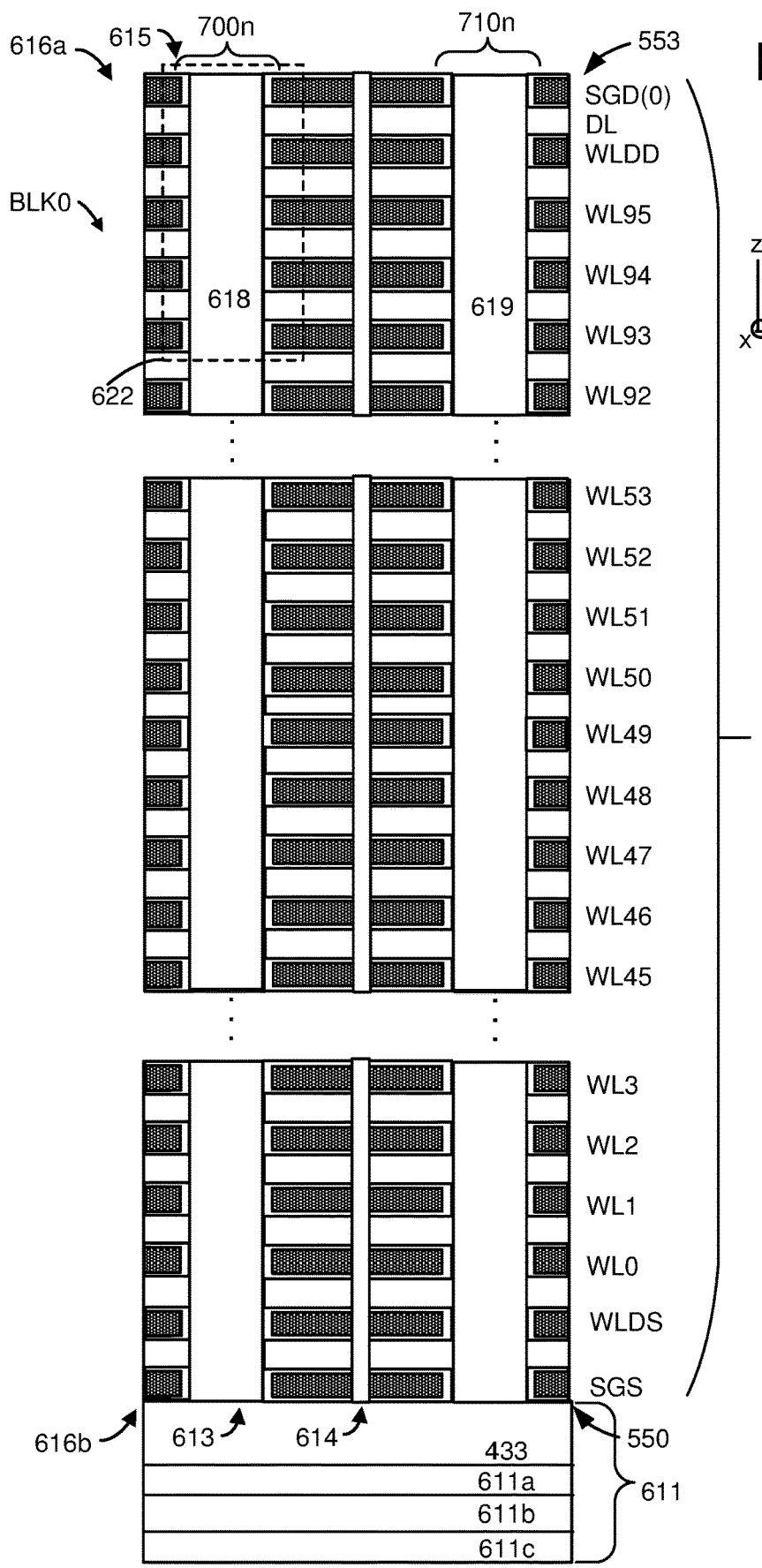
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, a driver 448 for unselected data word lines, and dummy word line drivers 449 and 449a which provide voltages on dummy word lines WLDD and WLDS, respectively, in FIG. 6A.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIG. 7. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
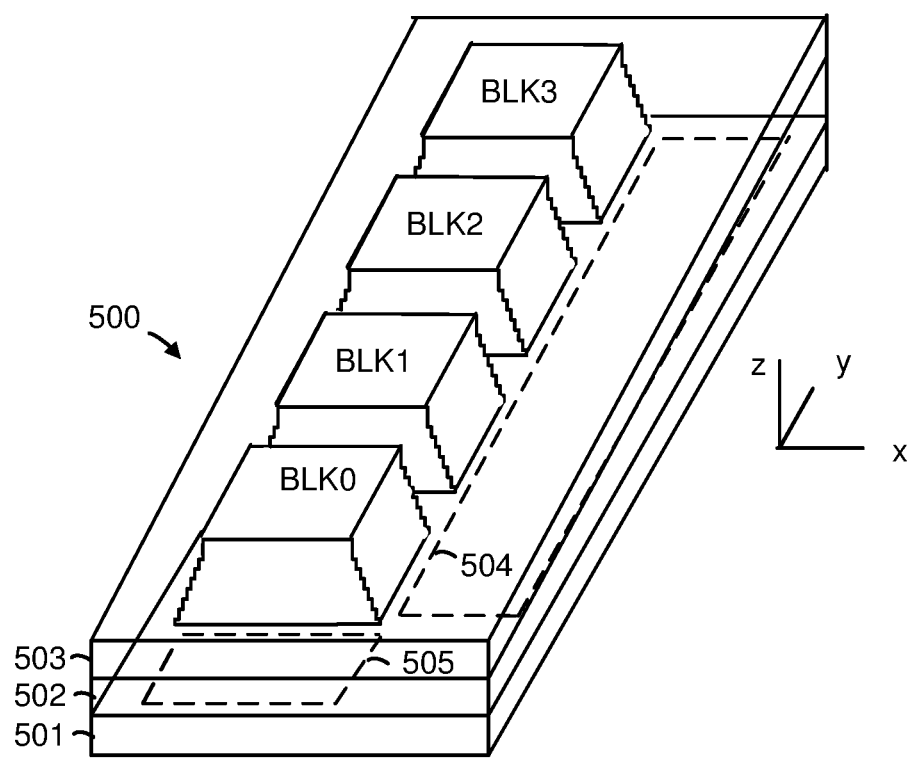
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
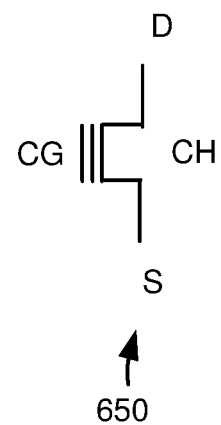
FIG. 5 depicts an example transistor 650.

FIG. 5 depicts an example transistor 650. The transistor comprises a control gate CG, a drain D, a source S and a channel CH and may represent a memory cell or a select gate transistor, for example.

FIG. 6A depicts an example cross-sectional view of a portion of BLK0 of FIG. 4, including NAND strings 700n and 710n. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. WL0-WL95 are data word lines connected to data memory cells, which are eligible to store user data. As an example only, the stack includes ninety-six data word lines. DL is an example dielectric layer.

A top 553 and bottom 550 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

Figure 6B:
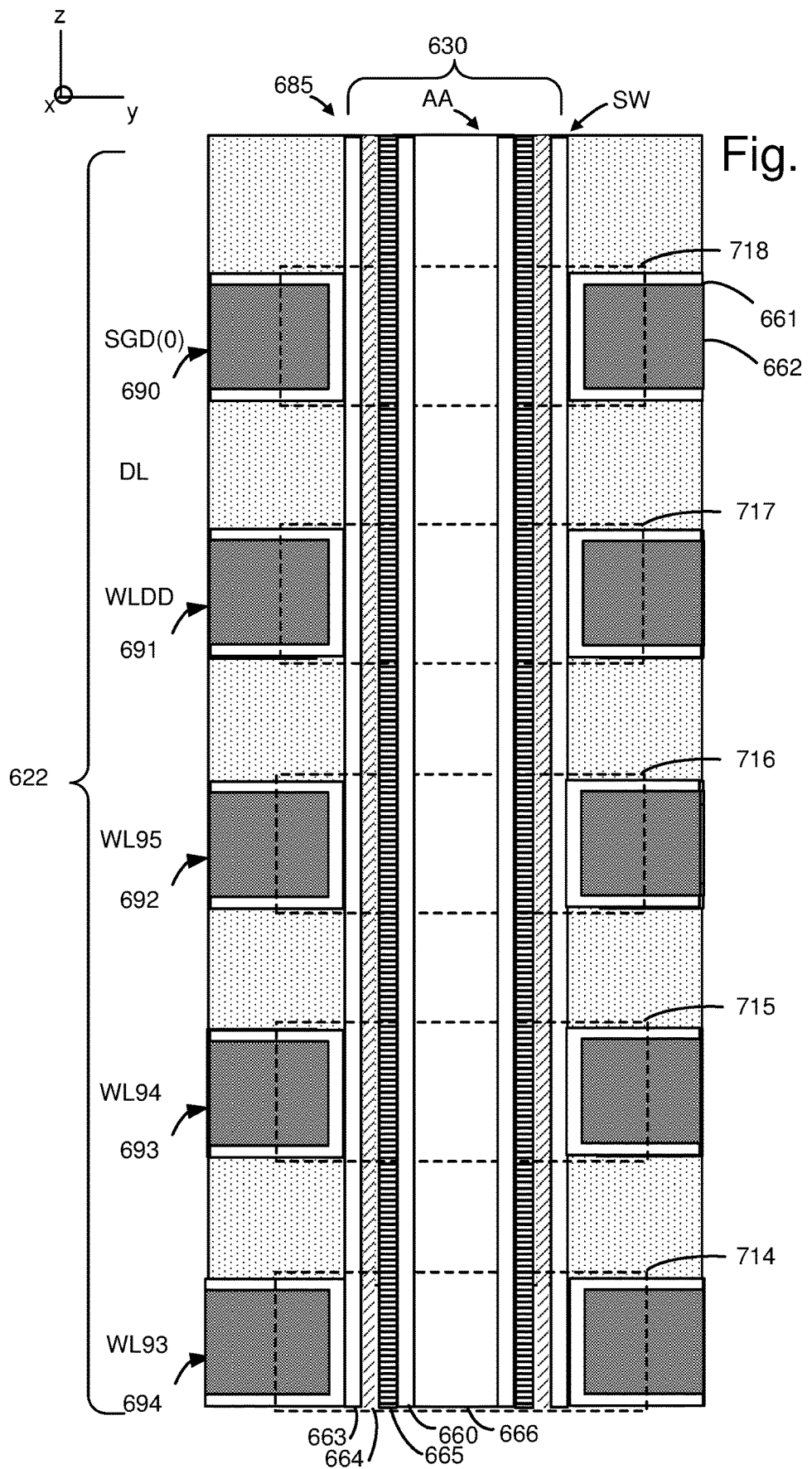
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. An SGD transistor 718 connected to SGD (0), a dummy memory cell 717 connected to WLDD and data memory cells 714-716 connected to WL93-WL95, respectively, are depicted.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Figure 7:
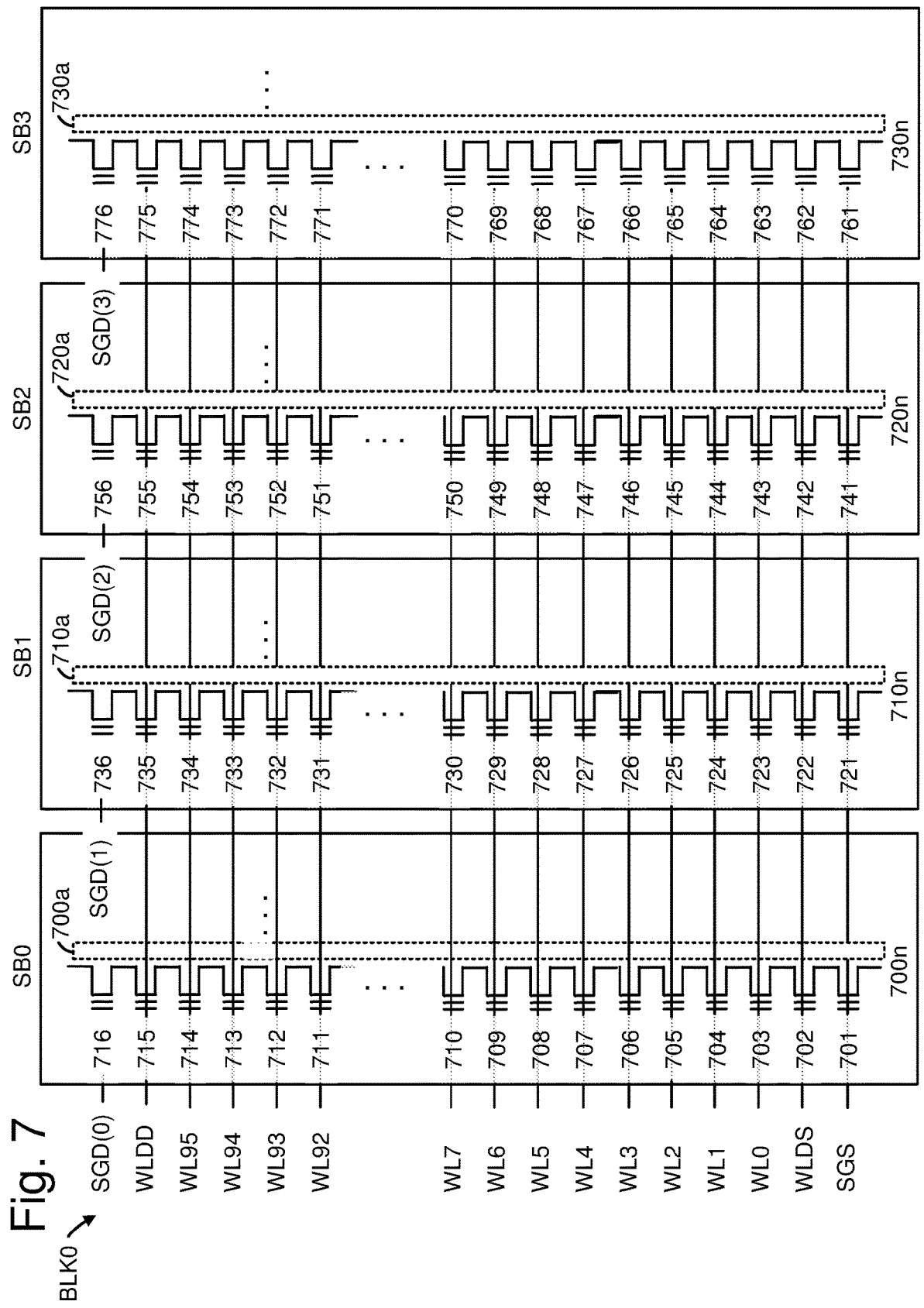
FIG. 7 depicts an example view of NAND strings in a block BLK0 which is consistent with FIGS. 4 and 6A.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. Another option programs all of the memory cells in one sub-block, one word line at a time, before programming the memory cells of the next sub-block. For example, this can involve programming WL0, then WL1 and so forth in SB0, followed by programming WL0, then WL1 and so forth in SB1, and so forth. The word line programming order may start at WL0, the source-end word line and end at WL95, the drain-end word line, for example.

The NAND strings 700$n$, 710$n$, 720$n$ and 730$n$ have channels 700$a$, 710$a$, 720$a$ and 730$a$, respectively.

Additionally, NAND string 700$n$ includes SGS transistor 701, dummy memory cell 702, data memory cells 703-714, dummy memory cell 715 and SGD transistor 716. NAND string 710$n$ includes SGS transistor 721, dummy memory cell 722, data memory cells 723-734, dummy memory cell 735 and SGD transistor 736. NAND string 720$n$ includes SGS transistor 741, dummy memory cell 742, data memory cells 743-754, dummy memory cell 755 and SGD transistor 756. NAND string 730$n$ includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 8:
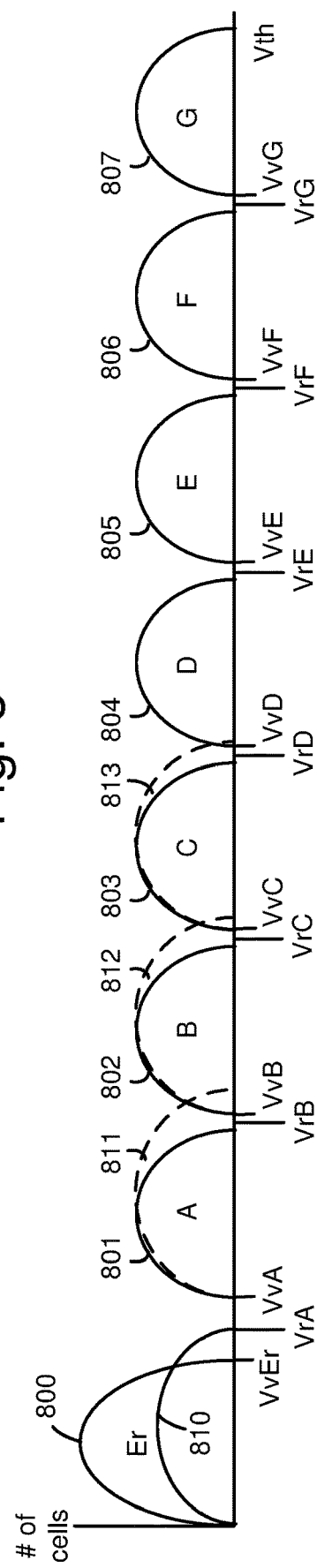
FIG. 8 depicts example Vth distributions of a set of memory cells with and without program disturb.

FIG. 8 depicts example Vth distributions of a set of memory cells with and without program disturb. The vertical axis depicts a number of memory cells on a logarithmic scale, and the horizontal axis depicts a Vth of the memory cells on a linear scale. In one approach, at a start of a program operation, the memory cells are all initially in the erased state, as represented by the Vth distribution 800. After the program operation is successfully completed, the memory cells assigned to the A-G states are represented by the Vth distributions 801-807.

The memory cells which are programmed to the A-G states using verify voltages of VvA-VvG, respectively, are represented by the Vth distributions 801-807, respectively. These Vth distributions are obtained just after completion of the program operation, and assume no program disturb has occurred. The verify voltages are used in the program-verify tests of the memory cells. Read voltages VrA-VrG can be used for reading the states of the memory cells in a read operation. These verify voltages and read voltages are examples of control gate read levels of the selected word line voltage.

However, due to program disturb, the Vth of the data memory cells can shift higher, as represented by the Vth distributions 810, 811, 812 and 813 for the Er, A, B and C data states, respectively. The amount of program disturb (amount of Vth upshift at the upper tail of the Vth distribution) is relatively larger for the relatively lower data states. The relatively high data states of D-G in this example are assumed to have no program disturb, as a simplification. The techniques described herein for reducing program disturb can reduce the amount of Vth upshift.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight state example. The number of data states could be higher or low than eight data states.

FIG. 9A depicts an example voltage signal in a program operation. The voltage signal can be used in a single pass program operation or in one pass of a multi-pass program operation. The program operation can be used to program memory cells to threshold voltages such as depicted in FIG. 8. The horizontal axis denotes a program loop (PL) number, ranging from 1-18, and the vertical axis denotes voltage. During a program operation, program loops are performed for a selected word line in a selected sub-block. A program loop comprises a program portion in which a program voltage or pulse is applied to the selected word line followed by a verify portion in which a verify signal or pulse is applied to the selected word line while one or more verify tests, referred to as program-verify tests, are performed for the associated memory cells. Other than the erased state, each assigned state has a verify voltage which is used in the verify test for the state in a program operation.

The voltage signal 900 includes a series of program voltages, including an initial program voltage 901, which are applied to a word line selected for programming In this example, the voltage signal includes program voltages which increase stepwise in amplitude in one or more program loops of a programming pass using a fixed or varying step size. This is referred to as incremental step pulse programming, where the program voltage (Vpgm) starts at an initial voltage, Vpgm_init, and increases in a step in each successive program loop, for instance, until the program operation is completed. A fixed step size of dVpgm is depicted. A successful completion occurs when the threshold voltages of the selected memory cells reach the verify voltages of the assigned data states. A program operation can include a single programming pass or multiple programming passes, where each pass uses incremental step pulse programming, for instance.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operation proceeds, such as depicted in FIG. 9B. The example verify signals depict three verify voltages as a simplification.

All memory cells may initially be in the erased state at the beginning of the program operation, for instance. After the program operation is completed, a Vth distribution similar to that in FIG. 8 is achieved, and the data can be read from the memory cells using read voltages which are between the Vth distributions. At the same time, a read pass voltage, Vpass (e.g., 8-10 V), also referred to as pass voltage or turn on voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. In each three-bit sequence, the UP bit is followed by the MP bit and then the LP bit. The data of the lower, middle and upper pages can be determined by reading the memory cells using read voltages of VrA and VrE; VrB, VrD and VrF; and VrC and VrG, respectively.

An example transition Vpgm, Vpgm_t1, consistent with FIG. 17A to 17F, is depicted, along with the corresponding example transition program loop number, PL_t1.

FIG. 9B depicts an example of verify voltages used in different program loops of FIG. 9A. The horizontal bars are time-aligned with the program loop axis of FIG. 9A. The set of verify voltages 910 includes VvA, VvB, VvC, VvD, VvE, VvF and VvG used in program loops 1-7, 2-9, 4-10, 5-12, 7-14, 8-16 and 10-18, respectively.

FIG. 10A depicts an example NAND string 1010 and its channel 1011, showing voltages during a pre-charge phase of a program loop. For generality, the NAND string includes memory cells 1002-1008 which are connected to word lines WLn−6 to WLn, respectively, and memory cells 1000 and 1001 are connected to word lines WLn−x−1 and WLn−x, which are x word lines away from WLn. In this example, the memory cells connected to WL0 through WLn−1 have been programmed at the time WLn is being programmed. The data states to which the memory cells are programmed is random but some data patterns are more likely to cause program disturb. For example, the memory cell 1000 is programmed to a high state with Vth=5 V (such as the G state in FIG. 8), the memory cells from WLn−x through WLn−4 are in the erased state with Vth=−1 V, the memory cells from WLn−3 through WLn−1 are in the high state with Vth=5 V and the memory cells of WLn are also in the erased state. The memory cells of WLn may be in the erased state if they have been assigned to a higher state but programming has just started, or if they have been assigned to the erased state, for instance.

The pre-charge phase is consistent with FIG. 16A-16D, where 0 V is applied to the word lines. This is the control gate voltage, Vcg=0 V.

FIG. 10B depicts example channel voltages along the length of the NAND string of FIG. 10A. The channel regions adjacent to the memory cells 1000 and 1005 will be about −5 V (0-5 V) so that the channel is cutoff as depicted. Residue electrons 1020 are trapped in a portion of the channel between memory cells 1000 and 1005. The channel region adjacent to the memory cell 1008 is about 2 V assuming Vbl=2 V (FIG. 16D) is introduced at the drain end of the NAND string.

FIG. 10C depicts the example NAND string of FIG. 10A when word line voltages are increased to Vpass, in an Example 1. Each of the word line voltages, including the selected and unselected word lines, is increased from 0 V to 10 V, for example.

FIG. 10D depicts example channel voltages along the length of the NAND string of FIG. 10C. The channel regions adjacent to the memory cells 1000-1007 will increase to about 5 V (−5+10 V) since the channel is coupled up by about the same amount as the increase of the word line voltage. The residue electrons 1020 are no longer trapped but are not yet strongly attracted toward WLn because the DIBL effect is not strong. The channel region adjacent to the memory cell 1008 and WLn increases to 12 V (2+10 V).

FIG. 10E depicts the example NAND string of FIG. 10A when the selected word line voltage is increased to Vpgm. The voltage of WLn is increased from 10 V (Vpass) to 20 V (Vpgm), for example. The channel region adjacent to the memory cell 1008 increases to 22 V (12+10 V). This voltage is high enough to cause the channel regions adjacent to the memory cells 1005-1007 to become conductive due to a DIBL effect, as mentioned at the outset. As a result, the residue electrons 1020 can move toward the higher voltage adjacent to WLn and can be injected into the charge trapping layers of the memory cells connected to WLn, as indicated by the large arrows. This is an example of injection type of program disturb.

FIG. 10F depicts example channel voltages along the length of the NAND string of FIG. 10E. As mentioned, the channel region adjacent to the memory cell 1008 increases to 22 V. In other examples, e.g., in FIGS. 12D and 13D, the channel region adjacent to the memory cell 1008 and WLn increases to 30 V (12+18 V). As Vpgm increases on WLn in the successive program loops of a program operation consistent with FIG. 9A, the voltage of the channel region adjacent to WLn also increases.

Examples 2-5 in FIG. 11A-14D, discussed below, avoid the program disturb depicted in FIG. 10F. Each Example can begin with the pre-charge configuration of FIG. 10A.

FIG. 11A depicts the example NAND string of FIG. 10A when word line voltages are increased to Vpass, in an Example 2. A difference relative to FIG. 10C is that an isolation word line (WLiso) is provided at WLn−5, which is separated from WLn by four other word lines. The DIBL effect discussed can extend over a few word lines on the source side of WLn. The source or drain side of a word line or memory cell is the side facing the source or drain end, respectively, of the NAND string. The location of WLiso should encompass the range in which the DIBL effect occurs. A further concern is that WLiso should not be too close to WLn since this can result in a high channel gradient on the source side of WLn which can generate electron-hole pairs. WLiso should not be too far from WLn since this can result in unnecessarily impairing boosting for memory cells and potentially increasing program disturb due to a high control gate-to-channel voltage. Typically, WLiso is separated from WLn by at least one, two, three, four or five or more over unselected word lines.

An isolation or cutoff region is created in the channel adjacent to WLn−5 by keeping the respective voltage at a low level such as 0 V even as the voltage is increased on other word lines to 10 V. The channel voltage adjacent to WLn−5 may therefore remain at −5 V. Optionally, the voltages on the word lines which are adjacent to WLn−5 can be increased to a level which is between 0 V and Vpass, such as 5 V. This results in a channel voltage of 0 V in the channel regions adjacent to WLn−6 and WLn−4. WLn−6 is the source side adjacent word line of WLiso (WLn−5), and WLn−4 is the drain side adjacent word line of WLiso (WLn−5). This approach helps smooth the channel gradient near WLiso to avoid the potential for electron-hole generation. The trapped residue electrons 1110 are on the source side of WLn−6, and are prevented from moving toward WLn by the isolation region in the channel adjacent to WLn−6 through WLn−4 and, in particular, adjacent to WLn−5.

Note that there are residue electrons in the channel regions between WLiso and WLn, e.g., between WLn−3 and WLn−1. However, since the number is relatively small, the associated risk of program disturb is also relatively small.

A further note is that the channel isolation region is provided on the source side of WLn since the programming order is from the source side word line WL0 to the drain side word line WL95. If the programming order is from the drain side word line to the source side word line, the channel isolation region should be provided on the drain side of WLn.

FIG. 11B depicts example channel voltages along the length of the NAND string of FIG. 11A. As mentioned, an isolation region is created in the channel adjacent to WLn−6 through WLn−4. In one implementation, at least one other word line, e.g., WLn−4 to WLn−1, separates the isolation word line WLn−5 from the selected word line. A control circuit is configured to increase a voltage of the at least one other word line which separates the isolation word line from the selected word line from the initial voltage to the pass voltage concurrently with the increasing of the voltage on the selected word line and the additional unselected word lines from the initial voltage to the pass voltage.

FIG. 11C depicts the example NAND string of FIG. 11A when the selected word line voltage is increased to Vpgm. When WLn increases to 20 V, for example, the associated channel region increases to 22 V. However, since the isolation region is maintained adjacent to WLn−6 through WLn−4 during the first portion of a time period in which Vpgm is maintained on WLn, the residue electrons remain trapped on the source side of WLn−6 and cannot move toward WLn.

FIG. 11D depicts example channel voltages along the length of the NAND string of FIG. 11C. A large channel gradient is created between WLn−4 and WLn but since the residue electrons remain trapped, they are not accelerated by the gradient toward the memory cells of WLn and program disturb is avoided. A channel isolation region 1115 or channel voltage trough is created due to the reduced voltages on WLn−6 to WLn−4. The channel isolation region has a center 1115c, a source side edge 1115s, and a drain side edge 1115d. In Example 2, the word lines involved in creating the channel isolation region are WL−6 to WLn−4. WLn−5 is used to create the center of the channel isolation region and WLn−6 and WLn−4 are used to create the source and drain side edges, respectively, of the channel isolation region. WLn−6 and WLn−4 source and drain side edges word lines, respectively, of the channel isolation region. The additional unselected word lines are WL0 to WLn−7, WLn−3 to WLn−1 and WLn+1 to WL95.

In one option, the channel isolation region extends over more than one source side and/or drain side word lines of WLiso. For example, with WLiso=WLn−5, the channel isolation region could extend over two source side word lines, e.g., WLn−6 and WLn−7, and two drain side word lines, e.g., WLn−4 and WLn−3. It is also possible for the number of such source side word lines to be different than the number of drain side word lines. WLn−6 is an example of a source side adjacent word line of WLn−5, WLn−7 is an example of a word line adjacent to WLn−6, WLn−4 is an example of a drain side adjacent word line of WLn−5, and WLn−3 is an example of a word line adjacent to WLn−4.

In another option, there are two or more word lines in the channel isolation region on the source side of the isolation word line, and two or more word lines in the channel isolation region on the drain side of the isolation word line. For instance instead of 5, 0 and 5 V on WLn−6 to WLn−4, respectively, there could be 7.5, 5, 0, 5 and 7.5 V on WLn−7 to WL−3, respectively. This provides a smoother transition in the channel gradient at edges of the isolation region.

FIG. 12A depicts the example NAND string of FIG. 10A when word line voltages are increased to Vpass, in an Example 3. This example differs from Example 2 in that WLiso is WLn−6 instead of WLn−5. An isolation or cutoff region is created in the channel adjacent to WLn−6 by keeping the voltage at a low level such as 0 V even as the voltage is increased on other word lines to 10 V. The channel voltage adjacent to WLn−6 may therefore remain at −5 V. The voltages on the word lines which are adjacent to WLn−6 can be increased to a level which is between 0 V and Vpass, such as 5 V. This results in a channel voltage of 0 V in the channel regions adjacent to WLn−7 and WLn−5. This approach helps smooth the channel gradient near WLiso, as mentioned. The trapped residue electrons 1110 are on the source side of WLn−7, and are prevented from moving toward WLn by the isolation region in the channel adjacent to WLn−7 through WLn−5 and, in particular, adjacent to WLn−6.

FIG. 12B depicts example channel voltages along the length of the NAND string of FIG. 12A. An isolation region is created channel adjacent to WLn−7 through WLn−5.

FIG. 12C depicts the example NAND string of FIG. 12A when the selected word line voltage is increased to Vpgm. When WLn increases to 28 V (compared to 20 V in prior examples), the associated channel region increases to 30 V. However, since the isolation region is maintained adjacent to WLn−7 through WLn−5 during the first portion of a time period in which Vpgm is maintained on WLn, the residue electrons 1110 remain trapped on the source side of WLn−7 and cannot move toward WLn. Also, since the isolation word line is WLn−6 instead of WLn−5 as in prior examples, there is a longer channel region (e.g., extending over six word lines instead of five) to accommodate the difference in channel voltage between WLn and WLiso. As a result, the gradient, as expressed in terms of voltage over distance, is reduced. This reduces the risk of electron-hole pair generation. For example, the channel gradient between WLn−6 and WLn in FIG. 12D is 30−(−5)=35 V over six word lines=5.8 V per word line. In contrast, if WLiso=WLn−5, the channel gradient between WLn−5 and WLn is 30−(−5)=35 V over five word lines=7 V per word line. As depicted also in FIG. 17D, WLiso can move further away from WLn during the different program loops of a program operation to accommodate the increasing value of Vpgm.

FIG. 12D depicts example channel voltages along the length of the NAND string of FIG. 12C. As mentioned, the associated channel region of WLn increases to 30 V when WLn increases to 28 V. Vpgm may start at 15-20 V and reach 28-30 V at the end of a program operation, in one example. In Example 3, the word lines involved in creating the channel isolation region are WL−7 to WLn−5. The additional unselected word lines are WL0 to WLn−8, WLn−4 to WLn−1 and WLn+1 to WL95.

FIG. 13A depicts the example NAND string of FIG. 10A when word line voltages are increased to Vpass, in an Example 4. This example uses two adjacent isolation word lines, WLn−5 and WLn−6 to provide a stronger isolation of the residue electrons 1110. An isolation or cutoff region is created in the channel adjacent to WLn−5 and WLn−6 by keeping the respective voltages at a low level such as 0 V even as the voltage is increased on other word lines to 10 V. The channel voltage adjacent to WLn−5 and WLn−6 may therefore remain at −5 V. The voltages on the word lines which are adjacent to WLn−5 and WLn−6 (e.g., WLn−7 and WLn−4) can be increased to a level which is between 0 V and Vpass, such as 5 V. This results in a channel voltage of 0 V in the channel regions adjacent to WLn−7 and WLn−4. This approach helps smooth the channel gradient near WLiso, as mentioned. The trapped residue electrons 1110 are on the source side of WLn−7, and are prevented from moving toward WLn by the isolation region in the channel adjacent to WLn−7 through WLn−4 and, in particular, adjacent to WLn−5 and WLn−6.

FIG. 13B depicts example channel voltages along the length of the NAND string of FIG. 13A. The trough in the channel voltage extends across two word lines, WLn−5 and WLn−6, to provide a stronger isolation of the residue electrons compared to the case where the trough in the channel voltage extends across just one word line. It is also possible for the trough to extend across more than two word lines as well.

In this example, the unselected word lines comprise a first isolation word line WLn−5 and a second isolation word line WLn−6 which is adjacent to, and on a source side of, the first isolation word line. A control circuit is configured to increase a voltage on the second isolation word line from the initial voltage to the pass voltage concurrent with the increase of the voltage on the first isolation word line from the initial voltage to the pass voltage.

Another option is for multiple troughs separated from one another. For example, With Vcg=5 V for WLn−7, WLn−5 and WLn−3, and Vcg=0 V for WLn−6 and WLn−4, troughs in the channel voltage are created adjacent to WLn−6 and WLn−4 (with Vch=−5 V) and these troughs are separated from one another by a channel region adjacent to WLn−5 at 0 V.

FIG. 13C depicts the example NAND string of FIG. 13A when the selected word line voltage is increased to Vpgm. When WLn increases to 28 V, the associated channel region increases to 30 V. However, since the isolation region is maintained adjacent to WLn−7 through WLn−4 during the first portion of a time period in which Vpgm is maintained on WLn, the residue electrons 1110 remain trapped on the source side of WLn−7 and cannot move toward WLn. Also, when multiple isolation word lines are used (WLn−6 and WLn−5), the isolation is stronger.

FIG. 13D depicts example channel voltages along the length of the NAND string of FIG. 13C. The cutoff regions remain in the channel adjacent to WLn−5 and WLn−6. In Example 4, the word lines involved in creating the channel isolation region are WL−7 to WLn−4. The additional unselected word lines are WL0 to WLn−8, WLn−3 to WLn−1 and WLn+1 to WL95.

FIG. 14A depicts the example NAND string of FIG. 10A when word line voltages are increased to Vpass, in an Example 5. A difference relative to FIG. 11B is that a partial charge isolation is used rather than a full charge isolation. As depicted, e.g., in FIG. 17B, the charge isolation technique can switch from a partial charge isolation to a full charge isolation as the risk of injection disturb increases. When the risk is low, the partial charge isolation may allow some source-side residue electrons to move toward WLn while allowing some channel boosting for the memory cells connected to WLiso to reduce the likelihood of program disturb for these memory cells due to a high control gate-to-channel voltage. When the risk is high, the full charge isolation provides a stronger isolation of the source-side residue electrons to reduce the risk of electron injection type of program disturb which becomes greater than the risk of program disturb due to a high control gate-to-channel voltage.

A partial isolation region 1120 is created in the channel adjacent to WLn−5 by keeping the respective voltage at a relatively low level such as 2.5 V, but not as low as the 0 V example of FIG. 11A, as the voltage is increased on other word lines to 10 V. This results in a channel voltage of −2.5 V adjacent to WLn−5. The voltages on the word lines which are adjacent to WLn−5 can be increased to a level such as 7.5 V which is higher than the 5 V of FIG. 11A. This results in a channel voltage of 2.5 V in the channel regions adjacent to WLn−6 and WLn−4.

FIG. 14B depicts example channel voltages along the length of the NAND string of FIG. 14A. The trough in the channel voltage is −2.5 V rather than the lower value of −5 V in FIG. 11B.

FIG. 14C depicts the example NAND string of FIG. 14A when the selected word line voltage is increased to Vpgm. When WLn increases to 20 V, the associated channel region increases to 22 V. The partial isolation region is maintained adjacent to WLn−6 through WLn−4 during the first portion of a time period in which Vpgm is maintained on WLn, so that the residue electrons 1110 remain partially trapped on the source side of WLn−6. Some of the residue electrons may move toward WLn.

FIG. 14D depicts example channel voltages along the length of the NAND string of FIG. 14C. The channel voltages are 2.5 V, −2.5 V and 2.5 V adjacent to WLn−6, WLn−5 and WLn−4, respectively. In Example 5, the word lines involved in creating the channel isolation region are WL−6 to WLn−4. The additional unselected word lines are WL0 to WLn−7, WLn−3 to WLn−1 and WLn+1 to WL95.

FIG. 15A depicts an example process for performing a program loop in which a charge isolation technique is used as a program disturb countermeasure. A program operation can involve multiple program loops in one or more passes. The program loop begins at step 1500. A pre-charge phase 1690 (FIG. 16A) is performed at step 1501. A program phase 1691 (FIG. 16A) is performed at step 1502. This includes increasing an isolation word line voltage (plot 1614 and 1615 in FIG. 16B) to Vpass after increasing a selected word line voltage (plot 1604 in FIG. 16A) to Vpgm. A verify phase 1692 (FIG. 16A) is performed at step 1503. See also FIGS. 15B and 16A-16D for further details.

FIG. 15B depicts an example process for performing a program operation which uses the process of FIG. 15A. Step 1510 begins a program operation. Step 1511 begins a program loop for a selected word line (WLn). Step 1512 includes reading the latches of the selected memory cells, e.g., to determine whether the memory cells are in a lockout or program state. The step also includes setting bit line voltages to inhibit programming of memory cells with the lockout state, e.g., by setting Vb1=2 V, and to allow programming of memory cells with the program state, e.g., by setting Vb1=0 V. Step 1513 includes performing a pre-charge phase by applying a positive bit line voltage to the drain ends of the NAND strings. See plot 1641 in FIG. 16D.

Step 1514 includes, in the program phase, increasing a voltage on the selected word line and additional unselected word lines from an initial voltage (e.g., 0 V) to a pass voltage, Vpass. See plots 1602 and 1612 in FIGS. 16A and 16B, respectively. The additional unselected word lines are word lines which are not involved in forming the isolation region. For example, in FIG. 11A-11C, the additional unselected word lines are WL0 to WLn−7, WLn−3 to WLn−1 and WLn+1 to WL95.

Step 1515 includes, in the program phase, increasing a voltage on the selected word line from Vpass to Vpgm (plot 1604 in FIG. 16A) and maintaining Vpgm for a period of time (plot 1605 in FIG. 16A). Step 1516 includes, in the program phase, increasing a voltage on an isolation word line from an initial voltage to Vpass (plot 1615 in FIG. 16B) during the period of time in which Vpgm is maintained on WLn (plot 1605 in FIG. 16A). Step 1517 includes decreasing the voltages on the word lines back to the initial voltage.

For example, the voltage on WLn can be decreased from Vpgm to 0 V (plot 1606 in FIG. 16A) and the voltage on the unselected word lines can be decreased from Vpass to 0 V (plot 1620 in FIG. 16B).

Generally, the voltage on the selected word line can be increased from the initial voltage to Vpgm in one or more steps.

In the verify phase, step 1518 includes performing verify tests for selected memory cells connected to WLn. Step 1519 includes updating the latches based on the results of the verify tests. For example, the latches can be updated from the program state to the lockout state for memory cells which pass a verify test at step 1518. A decision step 1520 determines if there is a next program loop. A next program loop may be performed if many memory cells have not completed programming or are otherwise not in the lockout state. If this is true, step 1522 includes stepping up Vpgm, and a next program loop begins at step 1511. If decision step 1520 is false, step 1521 denotes the end of the program operation. The program operation may be ended when all, or nearly all of the memory cells connected to WLn are in the lockout state.

FIG. 16A-16D depicts examples of voltage signals which can be used in a program loop of a program operation, consistent with FIGS. 15A and 15B. The vertical dimension denotes voltage and the horizontal dimension denotes time, with time points t0-t11. The period of time depicted corresponds to one program loop and includes a pre-charge phase 1690 (t0-t2), a program phase 1691 (t2-t8) and a verify phase 1692 (t8-t11). Example voltages of the signals are also depicted. A voltage signal 1600 represents VWLn, the voltage of the selected word line, a voltage signal 1610 represents Vwl_unsel, a voltage of unselected word lines, a voltage signal 1630 represents the select gate voltages, e.g., Vsgd and/or Vsgs, and a voltage signal 1640 represents Vbl, a bit line voltage.

FIG. 16A depicts voltages applied to a selected word line. The voltage signal 1600 is represented by a plot 1601 at an initial voltage such as 0 V, a plot 1602 representing a first increase in WLn, from the initial voltage to a pass voltage, Vpass, a plot 1603 in which WLn is maintained at Vpass from t3-t4, a plot 1604 representing a second increase, from Vpass to Vpgm, a plot 1605 representing a period of time in which the voltage on WLn is maintained at its peak level of Vpgm, a plot 1606 representing a decrease from Vpgm to the initial voltage, and a plot 1607 representing verify voltages of VvE, VvF and VvG, for example, for use in the verify phase.

FIG. 16B depicts voltages applied to unselected word lines. The voltage signal 1610 is represented by a plot 1611 at an initial voltage such as 0 V. For the additional word lines of step 1514 of FIG. 15B (the word lines not involved in forming the isolation region), a plot 1612 represents an increase in Vwl_unsel from the initial voltage to Vpass, plots 1613 and 1619 represent Vwl_unsel being maintained at Vpass, and a plot 1620 represents Vwl_unsel decreasing from Vpass to 0 V.

For the isolation word line which is used to form an isolation region, or is at the center of the isolation region when multiple word lines are used, a plot 1614 represents Vwl_unsel being maintained at the initial voltage such as 0 V while the voltages of the additional word lines and the selected word line are at Vpass. A plot 1615 represents Vwl_unsel increasing from 0 V to Vpass partway through the time period (d3) of t5-t7 in which Vpgm is maintained on WLn. For example, this increase could occur at least halfway (50%) or at least 70% through the time period and before the end of the time period. As mentioned, while Vwl_unsel is maintained at 0 V from t2-t6, the channel voltage adjacent to WLn tends to decay so that when Vwl_unsel is increased from 0 V to Vpass, the risk of hot injection type of program disturb is reduced. The channel voltage adjacent to WLn may decay over tens of microseconds. At the same time, the risk of gate-to-channel type of program disturb is also addressed since the increase in Vwl_unsel from 0 V to Vpass boosts the associated channel voltage for at least a portion of time period in which Vpgm is applied.

The time periods d1 and d2 represent first and second portions, respectively, of the time period (d3) in which Vpgm is maintained on WLn. In the first time period, the voltage on the isolation word line is maintained at the initial voltage. In the second time period, the voltage on the isolation word line is increased to and maintained at Vpass or other positive voltage.

For the word lines which are used to form edges of the isolation region, e.g., the source and drain side adjacent word lines of the isolation word line, a plot 1616 represents Vwl_unsel increasing from the initial voltage to a value which less than Vpass such as 5 V, consistent with prior examples. This increase can be concurrent with the increase of the additional word lines and WLn from the initial voltage to Vpass at t2. A plot 1617 represents Vwl_unsel being maintained at 5 V, and a plot 1618 depicts Vwl_unsel being increased from 5 V to Vpass. The level of plot 1617 can be half way, or 30-70%, between the initial voltage, e.g., 0 V and Vpass, for instance.

FIG. 16C depicts voltages applied to select gate transistors. The voltage signal 1630 is represented by a plot 1631 during the pre-charge for selected and unselected select gate transistors. The selected select gate (SG) transistors are in a selected sub-block (a sub-block selected for programming), and the unselected SG transistors are in unselected sub-blocks (sub-block which are not selected for programming) Subsequently, a plot 1632 with Vsg_sel=2.5 V represents the voltage of the selected SG transistors, and a plot 1633 with Vsg_unsel=2.5 V represents the voltage of the unselected SG transistors.

FIG. 16D depicts voltages applied to bit lines. The voltage signal 1640 is represented by a plot 1641, depicting a voltage Vbl=2 V, during the pre-charge for selected and unselected bit lines. The selected and unselected bit lines are connected to selected and unselected NAND strings, respectively, in a selected sub-block, in one approach. Subsequently, a plot 1642 depicts Vbl_unsel=2 V (a voltage on unselected bit lines), and a plot 1643 depicts Vbl_sel=0 V (a voltage on selected bit lines).

In the pre-charge phase, a positive Vbl (plot 1641) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end channel. It is also possible for the SGS transistors of the selected and unselected sub-blocks to be in a conductive state at this time, with a voltage of 6 V, for example (plot 1631) to allow the source line voltage (Vsl) to be passed to the source end of the channel In the program phase, VWLn and Vwl_unsel for the additional word lines are ramped up, e.g., starting at t2, to provide a capacitive coupling up of the channels of the unselected NAND strings. VWLn is then ramped up further at t4-t5 to the peak program pulse level of Vpgm and held at Vpgm until t7. After the program pulse, VWLn is ramped down to Vss (0 V). Subsequently, in the verify phase, one or more verify tests are performed by applying one or more control gate read voltages (plot 1607) on WLn and, for each read voltage, sensing the conductive state of the memory cells in the selected NAND strings of the selected sub-block.

During the program and verify phases, Vsg_sel can be set to, e.g., 2.5 V and 0 V, respectively, for the selected sub-block (plot 1632) and the unselected sub-blocks (plot 1633). During the program pulse, with Vb1=0 V (plot 1643), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 1642). Vbl_sel can be increased during the verify phase (t8411) as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t11, Vbl is decreased to 0 V so that the SGD transistors are cutoff and the channel region has a floating voltage.

This example shows VWLn increasing in a first step from 0 V to Vpass (an intermediate level, between the initial voltage and the peak voltage) and then in a second step from Vpass to Vpgm. Other embodiments are possible. For example, VWLn may increase to an intermediate level different than Vpass. In another example, VWLn may increase to Vpgm in more than two steps. In another example, VWLn may increase from 0 V to Vpgm in a single step. Although, a single step is typically avoided because it would cause a large increase in the channel gradient and a large amount of the injection type of program disturb.

Figure 17A:
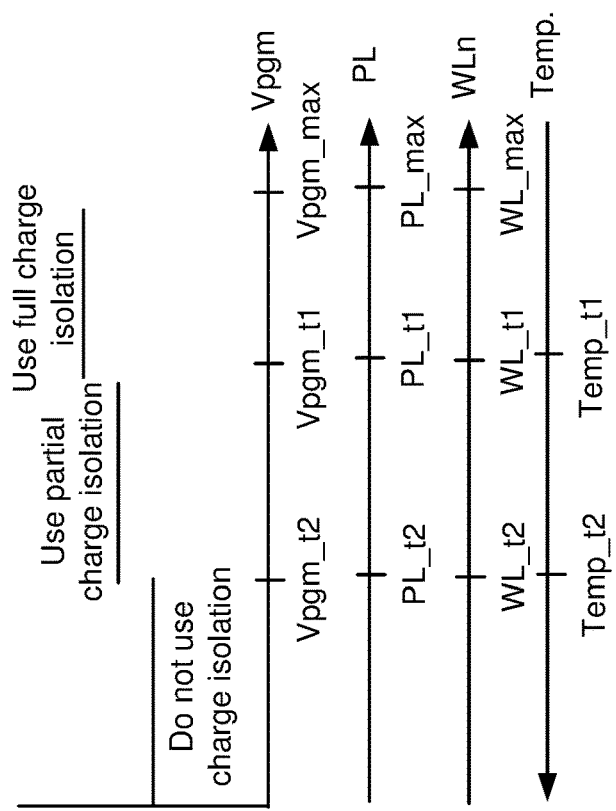
FIG. 17A depicts an example plot indicating when to use the charge isolation technique of Example 2-4 in FIG. 11A-13D, as a function of Vpgm, program loop (PL), WLn position and temperature (Temp.).

FIG. 17A depicts an example plot indicating when to use the charge isolation technique of Example 2-4 in FIG. 11A-13D in a program operation, as a function of Vpgm, program loop (PL), WLn position and temperature (Temp.). As mentioned, the risk of the injection type of program disturb can increase when Vpgm is greater, since the electrons are attracted to the charge trapping regions of the WLn memory cells in proportion to the magnitude of the control gate voltage of WLn. In an incremental step pulse programming operation such as shown in FIG. 9A, Vpgm increases in each successive program loop after the initial program loop. Accordingly, the likelihood of the injection type of program disturb is greater toward the end of a program operation, when Vpgm and the PL number are relatively high, compared to the beginning of the program operation, when Vpgm and the PL number are is relatively low.

Accordingly, the memory device can use the value of Vpgm, or the program loop number which is correlated with the value of Vpgm (see FIG. 9A), to determine whether to use the charge isolation technique. In one approach, the charge isolation technique is not used when Vpgm is below a first transition Vpgm, Vpgm_t1, or correspondingly, when PL below a first transition program loop number, PL_t1. The charge isolation technique is used when Vpgm is at or above Vpgm_t1 and/or PL is at or above PL_t1. Vpgm_t1 is greater than the initial Vpgm and less than the maximum Vpgm, Vpgm_max. PL_t1 is greater than the initial PL number (PL=1) and less than the maximum PL, PL_max.

Furthermore, when WLn is close to the source end of the NAND strings, the risk of injection type of program disturb is reduced because the number of source side residue electrons of WLn is reduced. Accordingly, the decision of whether to use the charge isolation technique can be a function of a position of WLn in the block, among the plurality of word lines of the block. When WLn is below a first transition WL, WL_t1, the charge isolation technique is not used. When WLn is at or above WL_t1, the charge isolation technique is used. WL_t1 can be spaced apart from WL0 by about 5-20% or 5-50% of the number of word lines in a block. For example, with 96 word lines, WL_t1 can be spaced apart from WL0 by about 5-20 word lines. That is, WL_t1 can range from WL6-WL21.

Additionally, the injection type of disturb is prevalent mainly at lower temperatures such as 40C or lower. Accordingly, the memory device can use the temperature provided by the temperature-sensing circuit 116 to determine when to implement the charge isolation technique described herein. In one approach, the charge isolation technique is used when the temperature is below a first transition temperature, Temp_t1, e.g., 40C, and not used when the temperature is at or above Temp_t1.

Figure 17B:
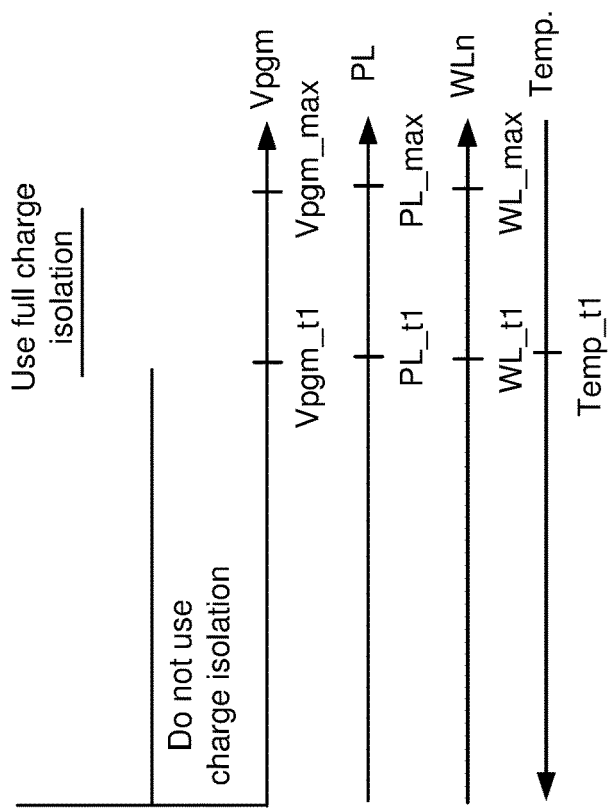
FIG. 17B depicts an example plot indicating when to use the full charge isolation technique of Example 2-4 in FIG. 11A-13D or the partial charge isolation technique of Example 5 of FIG. 14A-14D, as a function of Vpgm, PL, WLn position and Temp.

FIG. 17B depicts an example plot indicating when to use the full charge isolation technique of Example 2-4 in FIG. 11A-13D or the partial charge isolation technique of Example 5 of FIG. 14A-14D, as a function of Vpgm, PL, WLn position and Temp. As discussed in connection with Example 5 and FIG. 14A-14D, it is possible to implement a partial charge isolation technique when the risk of injection type of program disturb is moderate, and to implement a full charge isolation technique when the risk of injection type of program disturb is high. An increasing risk can be correlated with an increasing Vpgm and PL, WL position (WLn), and with a decreasing temperature.

In one approach, the charge isolation technique is not used when Vpgm<Vpgm_t2 (a second transition Vpgm), PL<PL_t2 (a second transition PL), WLn<WL_t2 (a second transition WL) or Temp>Temp_t2 (a second transition Temp.) The partial charge isolation technique is used when Vpgm_t2<=Vpgm<Vpgm_t1, PL_t2<=PL<PL_t1, WL_t2<=WLn<WL_t1, or Temp_t1<Temp<=Temp_t2. The full charge isolation technique is used when Vpgm>=Vpgm_t1, PL>=PL_t1, WLn>=WL_t1 or Temp<=Temp_t1. In these examples, Vpgm_t1>Vpgm_t2, PL_t1>PL_t2, WL_t1>WL_t2 and Temp_t2>Temp_t1.

FIG. 17C depicts an example plot indicating an adjustment regarding when to implement the charge isolation technique of FIG. 17A or 17B as a function of a number of program-erase cycles. Program disturb can increase as the number of P-E cycles increases for a block of memory cells. This is due to deterioration of the memory cells which makes them easier to program. Accordingly, one approach is to adjust the transition values in FIGS. 17A and 17B based on the number of P-E cycles. In one approach, when the number of P-E cycles is below a transition level of P-E_t1, there is no adjustment to the transition values. When the number of P-E cycles is at or above P-E_t1, there is an adjustment to the transition values. Another approach is to have more than one level of adjustments. The adjustment can include a decrease in the transition Vpgm or PL, or an increase in the transition temperature.

FIG. 17D depicts an example plot indicating a number of word lines separating the selected word line, WLn, and the isolation word line, WLiso, as a function of Vpgm, PL and Temp. As mentioned, e.g., in connection with Example 3 and FIG. 12A-12D, this separation can be increased when Vpgm is relatively high, to reduce the corresponding channel gradient. In one approach, the number of separation word lines, WLn-WLiso, is lower when Vpgm<Vpgm_t1 or PL<PL_t1. WLn-WLiso is higher when Vpgm>=Vpgm_t1 or PL>=PL_t1. WLn-WLiso can also be lower when Temp.>Temp_t1 and higher when Temp.>=Temp_t1. In one example, the lower value is 3 or 4 word lines and the higher value is 5 or 6 word lines.

In one implementation, a number of word lines which separate the isolation word line from the selected word line is an increasing function of a program loop number in the program pass.

In another implementation, a control circuit is configured to impose the delay of the increase of the voltage on the isolation word line from the initial voltage to the pass voltage in response to a determination that the selected word line is more than a specified number of word lines away from a source end of the NAND strings.

FIG. 17E depicts an example plot indicating a delay between the increase in the voltage of WLn to Vpgm and an increase in the voltage of WLiso from 0 V to Vpass, as a function of Vpgm, PL, WLn position and Temp. Recall the delay d1 in FIG. 16B. A larger delay is appropriate when there is a greater risk of the injection type of program disturb. Accordingly, the memory device can use the value of Vpgm, or the program loop number to determine the magnitude of the delay. In one approach, the delay is relatively low when Vpgm<Vpgm_t1, PL<PL_t1, WLn<WLt1 or Temp.>Temp_t1. The delay is relatively high when Vpgm>=Vpgm_t1, PL>=PL_t1, WLn>=WLt1 or Temp.<=Temp_t1. The relatively low delay could be 5-50% of the time period d3 (FIG. 16A) and the relatively high delay could be 50-70% of d3, for example.

In one implementation, a control circuit is configured to set a magnitude of the delay as a decreasing function of the temperature, i.e., the delay is greater when the temperature is lower.

In another implementation, a program pass comprises multiple program loops, the program voltage increases stepwise in successive program loops of the multiple program loops, and a control circuit is configured to track a program loop number during the program pass and to impose the delay of the increase of the voltage on the isolation word line from the initial voltage to the pass voltage in response to the program loop number reaching a transition program loop number. In a further option, as FIG. 17C depicts, the transition program loop number may be a decreasing function of a number of program-erase cycles of the set of memory cells, i.e., the transition program loop number is greater when the number of program-erase cycles is lower.

In another implementation, a control circuit is configured to track a program loop number during the program pass and to set a magnitude of the delay as an increasing function of the program loop number in the program pass, i.e., the delay is greater when the program loop number is greater.

In another implementation, a control circuit is configured to set a magnitude of the delay as an increasing function of a number of word lines between the selected word line and a source end of the NAND strings.

FIG. 17F depicts another example plot indicating a delay between the increase in the voltage of WLn to Vpgm and an increase in the voltage of WLiso from 0 V to Vpass, as a function of Vpgm, PL, WLn position and Temp. Based on three categories of a risk of program disturb, e.g., low, medium and high, a decision can be made to adjust the delay d1 to be low medium, or high, respectively. In one approach, a low delay is used when Vpgm<Vpgm_t2, PL<PL_t2, WLn<WL_t2 or Temp>Temp_t2. A medium delay is used when Vpgm_t2<=Vpgm<Vpgm_t1, PL_t2<=PL<PL_t1, WL_t2<=WLn<WL_t1 or Temp_t1<Temp<=Temp_t2. A high delay is used when Vpgm>=Vpgm_t1, PL>=PL_t1, WLn>=WL_t1 or Temp<=Temp_t1. The relatively low delay could be 5-30% of d3, the medium delay could be 30-50% of d2, and the relatively high delay could be 50-70% of d3, for example.

FIG. 17G depicts an example plot indicating a number of isolation word lines to use as a function of Vpgm, program loop (PL), WLn position and temperature (Temp.). As mentioned in connection with FIG. 13A to 13D, the number of isolation word lines can be increased to provide a stronger charge isolation region. In one approach, the number of isolation word lines can be increased, e.g., from a number N1 (e.g., one) to a number n2 (e.g., two) when the risk of the injection type of program disturb increases. For example, the number is N1 when Vpgm<Vpgm_t1, PL<PL_t1, WLn<WLt1 or Temp.>Temp_t1. The number is N2 when Vpgm>=Vpgm_t1, PL>=PL_t1, WLn>=WLt1 or Temp.<=Temp_t1.

In another approach, the number of isolation word lines can be set to three or more levels, e.g., using the transition values in FIG. 17B.

In one implementation, an apparatus comprises: a set of memory cells arranged in NAND strings, the set of memory cells comprises memory cells connected to a selected word line and memory cells connected to unselected word lines, the unselected word lines comprise an isolation word line which is on a source side of the selected word line and separated from the selected word line by at least one other word line, and the unselected word lines also comprise additional unselected word lines; and a control circuit. The control circuit, to program the selected memory cells in one program loop, is configured to concurrently increase a voltage on the selected word line and the additional unselected word lines from an initial voltage to a pass voltage, and subsequently increase the voltage on the selected word line from the pass voltage to a program voltage and maintain the voltage on the selected word line at the program voltage for a period of time, and increase a voltage on the isolation word line from an initial voltage to the pass voltage before an end of the period of time, and after a delay from the increase of the voltage on the selected word line from the pass voltage to the program voltage.

In another implementation, a method comprises: increasing a voltage on unselected word lines in a block from an initial voltage to a pass voltage; increasing the voltage on a selected word line to a program voltage and maintaining the voltage on the selected word line at the program voltage for a period of time; and increasing a voltage on an isolation word line from the initial voltage to the pass voltage before an end of the period of time, and after a delay from the increase of the voltage on the selected word line to the program voltage, wherein the isolation word line is on a source side of the selected word line and separated from the selected word line by at least one other word line.

In another implementation, an apparatus comprises: a set of memory cells arranged in NAND strings, the NAND strings are connected to a selected word line and to unselected word lines, the unselected word lines comprise a first isolation word line which is on a source side of the selected word line and separated from the selected word line by at least one other word line, and the unselected word lines also comprise additional unselected word lines; and a control circuit. The control circuit is configured to concurrently increase a voltage on the selected word line and the additional unselected word lines from an initial voltage to a pass voltage, subsequently increase the voltage on the selected word line from the pass voltage to a program voltage and maintain the voltage on the selected word line at the program voltage for a period of time, and increase a voltage on the first isolation word line from the initial voltage to the pass voltage before an end of the period of time, and after a delay from the increase of the voltage on the selected word line from the pass voltage to the program voltage.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings, the set of memory cells comprises memory cells connected to a selected word line and memory cells connected to unselected word lines, the unselected word lines comprise an isolation word line which is on a source side of the selected word line and separated from the selected word line by at least one other word line, and the unselected word lines also comprise additional unselected word lines; and
a control circuit, the control circuit, to program the selected memory cells in one program loop, is configured to concurrently increase a voltage on the selected word line and the additional unselected word lines from an initial voltage to a pass voltage, and subsequently increase the voltage on the selected word line from the pass voltage to a program voltage and maintain the voltage on the selected word line at the program voltage for a period of time, and increase a voltage on the isolation word line from an initial voltage to the pass voltage before an end of the period of time, and after a delay from the increase of the voltage on the selected word line from the pass voltage to the program voltage.

2. The apparatus of claim 1, wherein:
the unselected word lines comprise a source side adjacent word line of the isolation word line and a drain side adjacent word line of the isolation word line; and
the control circuit is configured to increase voltages of the source side adjacent word line and the drain side adjacent word line from a respective initial voltage to a voltage which is partway between the respective initial voltage and the pass voltage concurrently with the increase of the voltage on the selected word line and the additional unselected word lines from the initial voltage to the pass voltage.

3. The apparatus of claim 1, wherein:
the voltage on the isolation word line is increased from the initial voltage to the pass voltage at least half way through the period of time in which the voltage on the selected word line is maintained at the program voltage.

4. The apparatus of claim 1, further comprising:
a temperature-sensing circuit configured to provide an indication of a temperature, wherein the delay of the increase of the voltage on the isolation word line from the initial voltage to the pass voltage is imposed in response to a determination that the temperature is below a transition temperature.

5. The apparatus of claim 1, further comprising:
a temperature-sensing circuit configured to provide an indication of a temperature, wherein the control circuit is configured to set a magnitude of the delay as a decreasing function of the temperature.

6. The apparatus of claim 1, wherein:
the one program loop is in a program pass comprising multiple program loops;
the program voltage increases step-wise in successive program loops of the multiple program loops; and
the control circuit is configured to track a program loop number during the program pass and to impose the delay of the increase of the voltage on the isolation word line from the initial voltage to the pass voltage in response to the program loop number reaching a transition program loop number.

7. The apparatus of claim 6, wherein:
the transition program loop number is a decreasing function of a number of program-erase cycles of the set of memory cells.

8. The apparatus of claim 1, wherein:
the one program loop is in a program pass comprising multiple program loops;
the program voltage increases step-wise in successive program loops of the multiple program loops; and
the control circuit is configured to track a program loop number during the program pass and to set a magnitude of the delay as an increasing function of the program loop number in the program pass.

9. The apparatus of claim 1, wherein:
the control circuit is configured to impose the delay of the increase of the voltage on the isolation word line from the initial voltage to the pass voltage in response to a determination that the selected word line is more than a specified number of word lines away from a source end of the NAND strings.

10. The apparatus of claim 1, wherein:
the control circuit is configured to set a magnitude of the delay as an increasing function of a number of word lines between the selected word line and a source end of the NAND strings.

11. The apparatus of claim 1, wherein:
the one program loop is in a program pass comprising multiple program loops;
the program voltage increases step-wise in successive program loops of the multiple program loops; and
a number of word lines which separate the isolation word line from the selected word line is an increasing function of a program loop number in the program pass.

12. The apparatus of claim 1, wherein:
the control circuit is configured to increase a voltage of the at least one other word line which separates the isolation word line from the selected word line from the initial voltage to the pass voltage concurrently with the increasing of the voltage on the selected word line and the additional unselected word lines from the initial voltage to the pass voltage.

13. A method, comprising:
increasing a voltage on unselected word lines in a block from an initial voltage to a pass voltage;

increasing the voltage on a selected word line to a program voltage and maintaining the voltage on the selected word line at the program voltage for a period of time; and increasing a voltage on an isolation word line from the initial voltage to the pass voltage before an end of the period of time, and after a delay from the increase of the voltage on the selected word line to the program voltage, wherein the isolation word line is on a source side of the selected word line and separated from the selected word line by at least one other word line.

14. The method of claim 13, further comprising:

increasing voltages of a source side adjacent word line and a drain side adjacent word line of the isolation word line from a respective initial voltage to a voltage which is partway between the respective initial voltage and the pass voltage before the increasing of the voltage on the isolation word line from the initial voltage to the pass voltage and after the increasing of the voltage on the unselected word lines from the initial voltage to the pass voltage and the increasing of the voltage on the selected word line to the pass voltage.

15. The method of claim 13, further comprising:

increasing voltages of a source side adjacent word line and a drain side adjacent word line of the isolation word line from a respective initial voltage to a voltage which is partway between the respective initial voltage and the pass voltage concurrently with the increasing of the voltage on the unselected word lines from the initial voltage to the pass voltage.

16. The method of claim 13, further comprising:

increasing a voltage of the at least one other word line which separates the isolation word line from the selected word line from the initial voltage to the pass voltage concurrently with the increase of the voltage on the unselected word lines from the initial voltage to the pass voltage.

17. An apparatus, comprising:

a set of memory cells arranged in NAND strings, the NAND strings are connected to a selected word line and to unselected word lines, the unselected word lines comprise a first isolation word line which is on a source side of the selected word line and separated from the selected word line by at least one other word line, and the unselected word lines also comprise additional unselected word lines; and a control circuit configured to concurrently increase a voltage on the selected word line and the additional unselected word lines from an initial voltage to a pass voltage, subsequently increase the voltage on the selected word line from the pass voltage to a program voltage and maintain the voltage on the selected word line at the program voltage for a period of time, and increase a voltage on the first isolation word line from the initial voltage to the pass voltage before an end of the period of time, and after a delay from the increase of the voltage on the selected word line from the pass voltage to the program voltage.

18. The apparatus of claim 17, wherein:

the control circuit is configured to increase a voltage of the at least one other word line which separates the first isolation word line from the selected word line from the initial voltage to the pass voltage concurrently with the increase of the voltage on the selected word line and the additional unselected word lines from the initial voltage to the pass voltage.

19. The apparatus of claim 17, wherein:

the unselected word lines comprise a second isolation word line which is adjacent to, and on a source side of, the first isolation word line; and the control circuit is configured to increase a voltage on the second isolation word line from the initial voltage to the pass voltage concurrent with the increase of the voltage on the first isolation word line from the initial voltage to the pass voltage.

20. The apparatus of claim 17, further comprising:

a temperature-sensing circuit configured to provide an indication of a temperature, wherein the control circuit is configured to increase a voltage on a second isolation word line which is adjacent to the first isolation word line from the initial voltage to the pass voltage concurrent with the increase of the voltage on the first isolation word line from the initial voltage to the pass voltage, in response to a determination that the temperature is below a transition temperature.

* * * * *